(12) United States Patent
Takagi et al.

(10) Patent No.: US 7,579,932 B2
(45) Date of Patent: Aug. 25, 2009

(54) RESONATOR SAW FILTER HAVING A CONTROL INTERDIGITAL TRANSDUCER BETWEEN INPUT AND OUTPUT INTERDIGITAL TRANSDUCERS

(75) Inventors: Michiaki Takagi, Suwa (JP); Katsuro Yoneya, Azumino (JP); Masahiro Oshio, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 217 days.

(21) Appl. No.: 11/571,432

(22) PCT Filed: Jul. 1, 2005

(86) PCT No.: PCT/JP2005/012634

§ 371 (c)(1),
(2), (4) Date: May 21, 2007

(87) PCT Pub. No.: WO2006/004199

PCT Pub. Date: Jan. 12, 2006

(65) Prior Publication Data

US 2008/0018416 A1     Jan. 24, 2008

(30) Foreign Application Priority Data

Jul. 6, 2004 (JP) ............................ 2004-199425
Aug. 18, 2004 (JP) ............................ 2004-238059

(51) Int. Cl.
*H03H 9/145* (2006.01)
*H03H 9/25* (2006.01)
*H03H 9/64* (2006.01)

(52) U.S. Cl. ............... 333/195; 310/313 B; 310/313 D; 333/193

(58) Field of Classification Search ......... 333/193–196; 310/313 B, 313 D
See application file for complete search history.

(56) References Cited

U.S. PATENT DOCUMENTS

| 5,220,234 | A | 6/1993 | Flory et al. |
| 6,259,336 | B1 * | 7/2001 | Ichikawa .................... 333/193 |
| 6,335,667 | B1 | 1/2002 | Takagi et al. |
| 6,674,345 | B2 * | 1/2004 | Nakamura et al. .......... 333/193 |
| 6,972,643 | B2 * | 12/2005 | Tsunekawa et al. ......... 333/195 |
| 7,071,796 | B2 * | 7/2006 | Ueda et al. .................. 333/195 |

FOREIGN PATENT DOCUMENTS

JP     A-62-188512     8/1987

(Continued)

OTHER PUBLICATIONS

Machine translation of JP 8-298432 published Nov. 12, 1996.*

(Continued)

*Primary Examiner*—Barbara Summons
(74) *Attorney, Agent, or Firm*—Oliff & Berridge, PLC

(57) ABSTRACT

A longitudinally coupled multi-mode SAW resonator filter includes input and output interdigital transducers (IDTs) with a control IDT therebetween to control a state of the surface acoustic wave. The input, output, and control IDTs alternatively arrange two different zones C and E having respective electrode period lengths PC and PE, being equal to a sum of the electrode finger width L and spacing S between electrode fingers, and a number of respective pairs MC and ME of electrode fingers is set to 1 in both zones C and E. Electrode fingers in zones C and E are all connected to a feeder conductor. Hence, a filter having small insertion loss, and a wide fractional bandwidth of 2000-4000 ppm is achieved by canceling and decreasing sums of reflected waves from the electrode fingers in zones C and E, and decreasing the effective reflection coefficient per the electrode finger.

12 Claims, 13 Drawing Sheets

FOREIGN PATENT DOCUMENTS

| | | | |
|---|---|---|---|
| JP | A-04-132409 | | 5/1992 |
| JP | A-08-204502 | | 8/1996 |
| JP | 8-298432 | * | 11/1996 |
| JP | 9-321567 | * | 12/1997 |
| JP | A-2002-528984 | | 9/2002 |
| JP | A-2002-528987 | | 9/2002 |
| JP | A-2003-179461 | | 6/2003 |
| WO | WO 00/13316 A1 | | 3/2000 |

OTHER PUBLICATIONS

T. Nishikawa et al., "SH-Type Surface Acoustic Waves on Rotated Y-Cut Quartz", Proc. 34$^{th}$ Ann. Freq. Control Symposium, (May 1980) pp. 286-291.

H. Yatsuda, "SAW Device Assembly Technology", International Symposium on Acoustic Wave Device for Future Mobile Communication System, Chiba University, (Mar. 5, 2001) pp. 189-194.

* cited by examiner

RESONATOR SAW FILTER HAVING A CONTROL INTERDIGITAL TRANSDUCER BETWEEN INPUT AND OUTPUT INTERDIGITAL TRANSDUCERS

TECHNICAL FIELD

The present invention relates to a resonator type SAW (Surface Acoustic Wave) filter such as a multi-longitudinal-mode resonator type which is realized by arranging on a piezoelectric substrate an input and interdigital transducer, an output interdigital transducer, and a pair of reflectors at outer sides of the input and output interdigital transducers and by utilizing a surface acoustic wave such as a Rayleigh wave, an STW (Surface Transversal Wave), an SSBW (Surface Skimming Bulk Acoustic Wave), an SH wave, a love wave, an SEZAWA wave, and the like.

RELATED ART

An STW cut quartz crystal substrate has been used as a substrate of a resonator type SAW filter. This substrate has been studied and used from as early as 1979.

In the STW cut quartz crystal substrate, which is already well known, an electrical axis X, a mechanical axis Y, and an optical axis Z serving as basic axes of a quartz crystal compose an orthogonal coordinate system, in which a Y plate perpendicular to the machine axis Y is rotated θ degrees around the electrical axis X. Herein, θ is set to a range of 33 to 47 degrees so as to exhibit a 0 temperature coefficient. The SAW device using this substrate utilizes an STW type or an SSBW type surface acoustic wave that propagates in a direction of an optical axis Z' after rotation of the Y plate (See Non-Patent Document 1).

A two or three-longitudinal-mode-coupled resonator type SAW filter is made of the aforementioned STW cut quartz crystal substrate, resulting in the SAW device with a 1 to 3 GHz bandwidth. Patent Documents 1, 2, and 3 are examples of related art of the aforementioned resonator type SAW filter. Non-Patent Document 2 is also a second example of the resonator type SAW filter achieved by related art.

[Patent Document 1] Japanese Unexamined Patent Application Publication No. 62-188512.

[Patent Document 2] WO00/13316.

[Patent Document 3] U.S. Pat. No. 5,220,234 specification.

[Non-Patent Document 1] "SH-TYPE SURFACE ACOUSTIC WAVES ON ROTATED Y-CUT QUARTZ" by T. NISHIKAWA et al, Proc. 34th Ann. Freq. Control Symposium, pp. 286-291 (May 1980).

[Non-Patent Document 2] "SAW Device Assembly Technology" by Hiromi Yatsuda, International Symposium on Acoustic Wave Device for Future Mobile Communication System, Chiba University pp. 189-194 (5th Mar. 2001).

However, there has been a primary problem such that related art as described above realizes the resonator type SAW filters with only an extremely narrow fractional bandwidth of about 500 ppm. See the second example. Herein, the fractional bandwidth is a value determined by dividing a 3 dB bandwidth by a filter center frequency.

Thus, the present invention is intended to attain a solution by diagnosing the cause of this narrow fractional bandwidth. Those problems are resolved by technical and logical means used in this invention, such as the introduction of interdigital transducers for control purposes with a periodical structure and utilization of a "frequency potential design method" devised by the inventor. Briefly speaking, the "frequency potential design method" is to utilize a following relational expression of a frequency potential function FTP (X), a speed of a surface acoustic wave Vs, and a space wavelength 2P (X) of an element to control propagation of an elastic undulation. The relation expression is set as $FTP(X)=Vs/\{2P(X)\}$. It is to be noted that X is a position coordinate in a phase progression direction of the surface acoustic wave.

This invention also provides a solution for improving a secondary problem of sideband wave components, which result from the aforementioned invention and cause noise occurrence.

This invention is intended to realize a multi-longitudinal-mode-coupled resonator type SAW filter with a small insertion loss and a relatively wide fractional bandwidth. The multi-longitudinal-mode-coupled resonator type SAW filter with a small insertion loss, a wide fractional bandwidth of 2000 to 4000 ppm, and stability is realized by using, for example, the STW cut quartz crystal substrate with a 0 temperature coefficient, excellent frequency-temperature characteristics, and a high speed surface acoustic wave, and a λ/4 electrode. Herein, a wavelength of propagated surface acoustic wave is set to λ and the width of electrode fingers of the interdigital transducers is set to λ/4.

DISCLOSURE OF THE INVENTION

A resonator type SAW filter of the present invention includes, on a piezoelectric substrate in a direction of propagation of a surface acoustic wave, an input interdigital transducer that excites the surface acoustic wave, an output interdigital transducer that receives the surface acoustic wave excited by the input interdigital transducer, a control interdigital transducer interposed between the input interdigital transducer and the output interdigital transducer that controls a state of the surface acoustic wave, and a pair of reflectors arranged on outer sides of both the input interdigital transducer and the output interdigital transducer. The input interdigital transducer, the output interdigital transducer, and the control transducer are composed of electrode fingers each arranged inside two different zones C and E that are alternatively arranged. The electrode finger is formed with a wide L set to approximately λ/4 on the condition of a wavelength of the surface acoustic wave set to λ. An electrode period length P is set as PC and a number of pairs MC of the electrode fingers is set to 1 in zone C and the electrode period length P is set as PE and a number of pairs ME of the electrode fingers is set to 1 in zone E on the condition that electrode period length P as a sum of the width L of the electrode finger and a spacing between the electrode fingers is equal to L+S. A ratio PE/PC of the electrode period lengths in zones C and E falls within a range of 0.8<PE/PC<1. The electrode fingers arranged in zones C and E are all connected to a feeder conductor.

According to the invention, since sums of reflected waves from the electrode fingers in zones C and E, respectively, decrease by canceling each other, the two-or three-longitudinal-mode-coupled resonator type SAW filter with a wide bandwidth can be easily realized by decreasing the effective reflection coefficient per the electrode finger. The electrode fingers in zones C and E are electrically connected to excite the elastic wave in a continuous manner, enabling small sideband wave component. According to the invention, the three-longitudinal-mode-coupled resonator type SAW filter with a fractional bandwidth of from 3000 to 4000 ppm can be realized even where an electrode film thickness is not extremely thinned, by using such an STW cut quartz crystal substrate that has electromechanical coupling coefficient $K^2$ as small as 0.002 and the surface acoustic wave of high speed of 5100 m/sec, which enables high frequency operation. There is such an effect that, for example, the resonator type SAW filter with characteristics of the aforementioned fractional bandwidth can be realized by providing the λ/4 electrode with a thickness of 100 nm at a frequency of 1.5 GHz.

In the invention, it is preferable that a reflection coefficient γ of the surface acoustic wave exhibited by one of the electrode fingers generated by the piezoelectric substrate and the interdigital transducers fall within a range from 0.03 to 0.10.

According to this structure, such the substrate can be utilized as having high speed as well as large reflection coefficient γ, such as the STW cut quartz crystal substrate having the surface acoustic wave of high speed of 5100 m/sec, which enables high frequency operation, or the substrate made of diamond having speed of 10000 m/sec. With respect to the resonator type SAW filter having a frequency of from 1 to 3 GHz using the aforementioned substrate, the reliable resonator type SAW filter can be provided by providing the λ/4 electrode with an enough thickness of approximately 100 nm.

In the invention, it is preferable that a resonance mode to be utilized be a three-longitudinal-mode combined based on a resonance phenomenon of a fundamental wave symmetrical mode S0, a fundamental wave anti-symmetric mode A0, and a primary symmetrical mode S1 and that an equivalent reflection coefficient γce of the surface acoustic wave exhibited by one of the electrode fingers provided to the whole of the interdigital transducers that are configured by alternatively arranging the electrode period lengths PC and PE fall within a range from 0.01 to 0.025.

According to this structure, the resonator type SAW filter with a bandwidth as wide as approximately 4000 ppm can be realized by setting to a three-longitudinal-mode relative to a wideband of 2000 ppm of a two-longitudinal mode composed of the fundamental wave symmetrical mode S0 and the fundamental wave anti-symmetric mode A0, thereby enabling easy frequency adjustment of the element and low cost production.

In the invention, it is preferable that the piezoelectric plate be a STW cut quartz crystal substrate, the interdigital transducer be made of aluminum metal, the reflection coefficient γ of the surface acoustic wave exhibited by one of the electrode fingers be set to 0.05±0.02, the ratio PE/PC of the electrode period lengths be set to 0.9±0.02, a number of pairs MK of the electrode fingers of the control interdigital transducer fall within a range from 10 to 30, a sum M of the electrode fingers of the input interdigital transducer and the output interdigital transducer be set to 80±10, an electrode cross width WC of the electrode finger be set to from 50 to 80λ, and that a number of conductors of the reflectors be set to from 30 to 100.

According to the resonator type SAW filter in this structure, an RF filter used for a GPS device operated in 1.57 GHz can be realized. Since the passband width is approximately 3 MHz, such improvements can be obtained, that the filter has a narrow bandwidth which is approximately 1/10 that of the existing filter using a LiTaO$_3$ substrate with a width of 30 MHz and has a S/N ratio ten times more than that of the existing filter with respect to received signals.

A resonator type SAW filter of the present invention includes, on a piezoelectric substrate in a direction of propagation of a surface acoustic wave, an input interdigital transducer that excites the surface acoustic wave, an output interdigital transducer that receives the surface acoustic wave excited by the input interdigital transducer, a control interdigital transducer interposed between the input interdigital transducer and the output interdigital transducer that controls a state of the surface acoustic wave, and a pair of reflectors arranged on outer sides of both the input interdigital transducer and the output interdigital transducer. The input interdigital transducer, the output interdigital transducer, and the control transducer are composed of electrode fingers each arranged inside two different zones that are G and H alternatively arranged. The electrode finger is formed with a wide L set to approximately λ/4 on the condition of a wavelength of the surface acoustic wave set to λ. An electrode period length P is set as PG and a number of pairs NG of the electrode fingers is set to 1 in zone G and the electrode period length P is set as PH and a number of pairs NH of the electrode fingers is set to 1 in zone H on the condition that electrode period length P as a sum of the width L of the electrode finger and a spacing between the electrode fingers is equal to L+S. A ratio PH/PG of the electrode period lengths in zones G and H falls within a range of 0.8<PH/PG<1. The electrode fingers arranged in zones G and H are connected to feeder conductors with different polarities, respectively.

According to the invention, since sums of reflected waves from the electrode fingers in zones G and H, respectively, decrease by canceling each other, the two-or three-longitudinal-mode-coupled resonator type SAW filter with a wide bandwidth can be easily realized by decreasing the effective reflection coefficient per the electrode finger. The electrode fingers in zones G and H are electrically connected to excite the elastic wave in a continuous manner, enabling sideband wave component to become nonexistent. According to the invention, the three-longitudinal-mode-coupled resonator type SAW filter with a fractional bandwidth of from 3000 to 4000 ppm can be realized even where an electrode film thickness is not extremely thinned, by using such a STW cut quartz crystal substrate that has electromechanical coupling coefficient $K^2$ as small as 0.002 and the surface acoustic wave of high speed of 5100 m/sec, which enables high frequency operation. There is such an effect that, for example, the resonator type SAW filter with characteristics of the aforementioned fractional bandwidth can be realized by providing the λ/4 electrode with a thickness of 100 nm at a frequency of 1.5 GHz.

In the invention, it is preferable that a reflection coefficient γ of the surface acoustic wave exhibited by one of the electrode fingers generated by the piezoelectric substrate and the interdigital transducers fall within a range from 0.03 to 0.10.

On this condition, such the substrate can be utilized as having high speed as well as large reflection coefficient γ, such as the STW cut quartz crystal substrate having the surface acoustic wave of high speed of 5100 m/sec, which enables high frequency operation, or the substrate made of diamond having speed of 10000 m/sec. With respect to the resonator type SAW filter having a frequency of from 1 to 3 GHz using the aforementioned substrate, the reliable resonator type SAW filter can be provided by providing the λ/4 electrode with an enough thickness of approximately 100 nm.

In the invention, it is preferable that a resonance mode to be utilized be a three-longitudinal-mode combined based on a resonance phenomenon of a fundamental wave symmetrical mode S0, a fundamental wave anti-symmetric mode A0, and a primary symmetrical mode S1 and that an equivalent reflection coefficient γgh of the surface acoustic wave exhibited by one of the electrode fingers provided to the whole of the interdigital transducers that are configured by alternatively arranging the electrode period lengths PG and PH fall within a range from 0.01 to 0.025.

On this condition, the resonator type SAW filter with a bandwidth as wide as approximately 4000 ppm can be realized by setting to a three-longitudinal-mode relative to a wideband of 2000 ppm of a two-longitudinal mode composed of the fundamental wave symmetrical mode S0 and the fundamental wave anti-symmetric mode A0, thereby enabling easy frequency adjustment of the element and low cost production.

In the invention, it is preferable that the piezoelectric plate be a STW cut quartz crystal substrate, the interdigital transducer be made of aluminum metal, the reflection coefficient γ of the surface acoustic wave exhibited by one of the electrode fingers be set to from 0.05±0.02, the ratio PH/PG of the electrode period lengths be set to 0.9±0.02, a number of pairs MK of the electrode fingers of the control interdigital transducer fall within a range from 10 to 30, a sum M of the electrode fingers of the input interdigital transducer and the output interdigital transducer be set to 80±10, an electrode cross width WC of the electrode finger be set to from 50 to 80λ, and that a number of conductors of the reflectors be set to from 30 to 100.

According to the resonator type SAW filter in this structure, an RF filter used for a GPS device operated in 1.57 GHz can be realized. Since the passband width is approximately 3 MHz, such improvements can be resulted, that the filter has a narrow bandwidth which is approximately 1/10 that of the existing filter using a $LiTaO_3$ substrate with a width of 30 MHz and has a S/N ratio ten times more than that of the existing filter with respect to received signals.

In the invention, it is preferable that a center frequency f (Ref) of the reflector and a frequency f (IDT) generated by the interdigital transducer with the electrode period length PE or PH be equalized.

With this structure, since reflection characteristics exhibited by the reflectors can be maximally utilized, the number of conductors of the reflectors can be decreased to enable downsizing of the resonator type SAW filter.

In the invention, it is preferable that the STW cut quartz crystal substrate be a quartz crystal plate having a quartz crystal Y plate rotated θ equal to from 35 to 38 degrees around an electronic axis (X axis) in a counterclockwise direction.

With this structure, since a frequency temperature coefficient is set as a zero temperature coefficient while a second order temperature coefficient β is set to $-6.4 \times 10^{-8}/° C.^2$, the frequency fluctuation of the element is as small as 270 ppm and is stable in a using temperature range of from −45 to 85° C., thereby having a small effect on jitter (variation in accuracy of time) of the received signals.

INDUSTRIAL APPLICABILITY

Considered herein is specific use of the resonator type SAW filter according to the invention. Characteristics in the case of manufacturing of the RF filter of 1.57 GHz using the STW cut quartz crystal substrate are listed as follows.

1. The frequency temperature characteristic has the zero temperature coefficient, thereby being stabilized (a frequency fluctuation amount is as small as 270 ppm within a range of from approximately 45 to 85 degrees Celsius).

2. A material has excellent Q-value and the Q-value of the resonator is as high as approximately 6000 at 1.5 GHz, enabling a low-loss filter of 2 dB.

3. The reflection coefficient exhibited by the IDTs is decreased by configuring zones C and E or zones E and G periodically, enabling the filter with a fractional bandwidth of approximately 3000 ppm. This bandwidth becomes a passband width of 3 MHz, thereby sufficiently covering a range of 2 MHz of the frequency component of the signal to be used for the GPS devices.

4. The filter of 50Ω with a small amplitude ripple within a range of the passband width can be realized.

In the case of application of the resonator type SAW filter according to the invention to the RF filter for the GPS device, the passband width of approximately 3 MHz can be ensured at 1.57 GHz, so that a noise level received by the device can be decreased to approximately 1/10 that of the filter with the passband width of approximately 30 MHz, manufactured using the existing $LiTaO_3$ substrate. Furthermore, since the frequency fluctuation is small relative to change in temperature, such a digital signal with small phase fluctuation, which is set as low jitter and low phase noise, so that the GPS device can be provided, which has no variation in geodetic accuracy to allow a position thereof to be measured with high accuracy.

Other than weak short range wireless such as a UWB (Ultra Wide Band) and the like, used in a band of from 3 to 10 GHz, which are in a phase of commercialization, a means for using the GPS device and the UWB or other communication devices in a closed manner has been studied. Since there is concern for a further increase of the electromagnetic noise, the application of resonator type SAW filter according to this invention to those fields is thought to result in the elements which are more beneficial to maintenance of geodetic accuracy.

DESCRIPTION OF THE PREFERRED EMBODIMENTS

Figure 8:
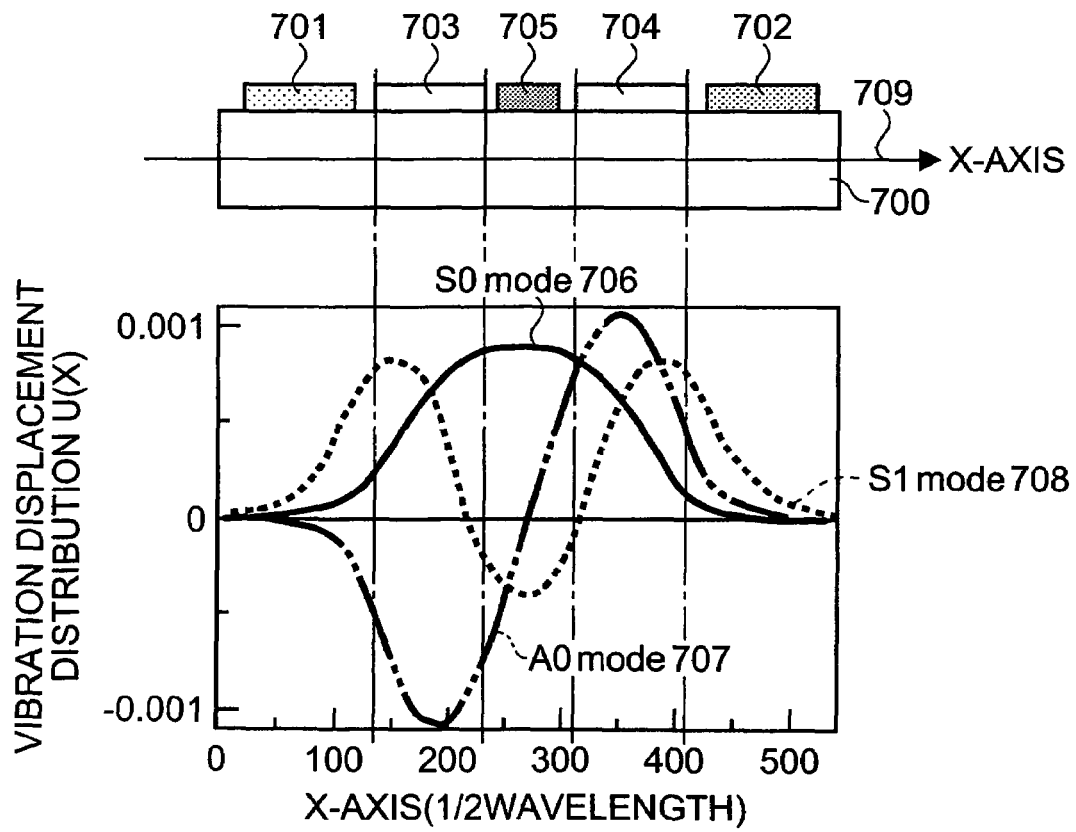
FIG. 8 is a view illustrating a state of a vibration displacement of the resonator type SAW filter according to the invention.
Figure 9:
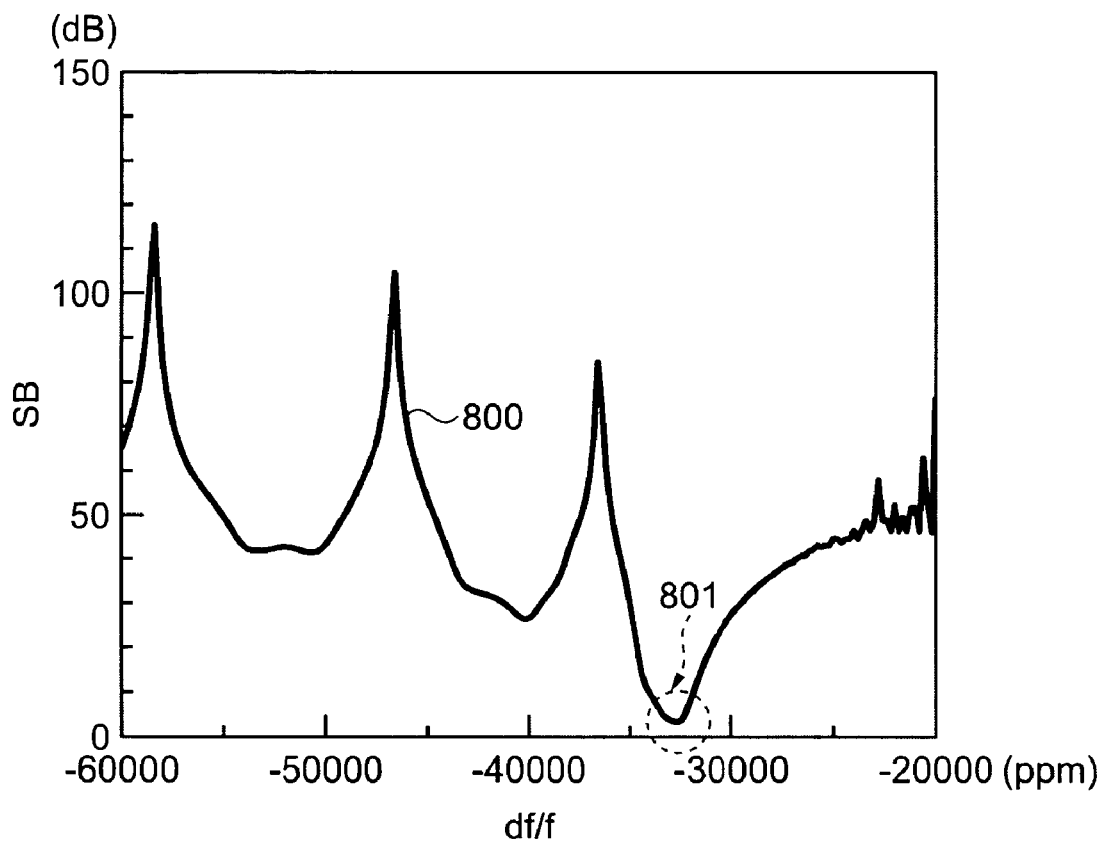
FIG. 9 is a characteristic diagram showing one transmission characteristic of a resonator type SAW filter according to related art.

Hereinafter, to facilitate understanding of embodiments of a resonator type SAW filter according to the present invention, detailed structures of embodiments are explained with reference to FIG. 1, principles of basic operation are explained with reference to FIGS. 2, 3, 4, 5, 6, and 8, characteristics of existing products are illustrated in FIGS. 9, 10, and 13, and characteristics of the resonator type SAW filter according to the invention are explained in detail with reference to FIGS. 7, 11, 12, and 14.

First Embodiment

Figure 1:
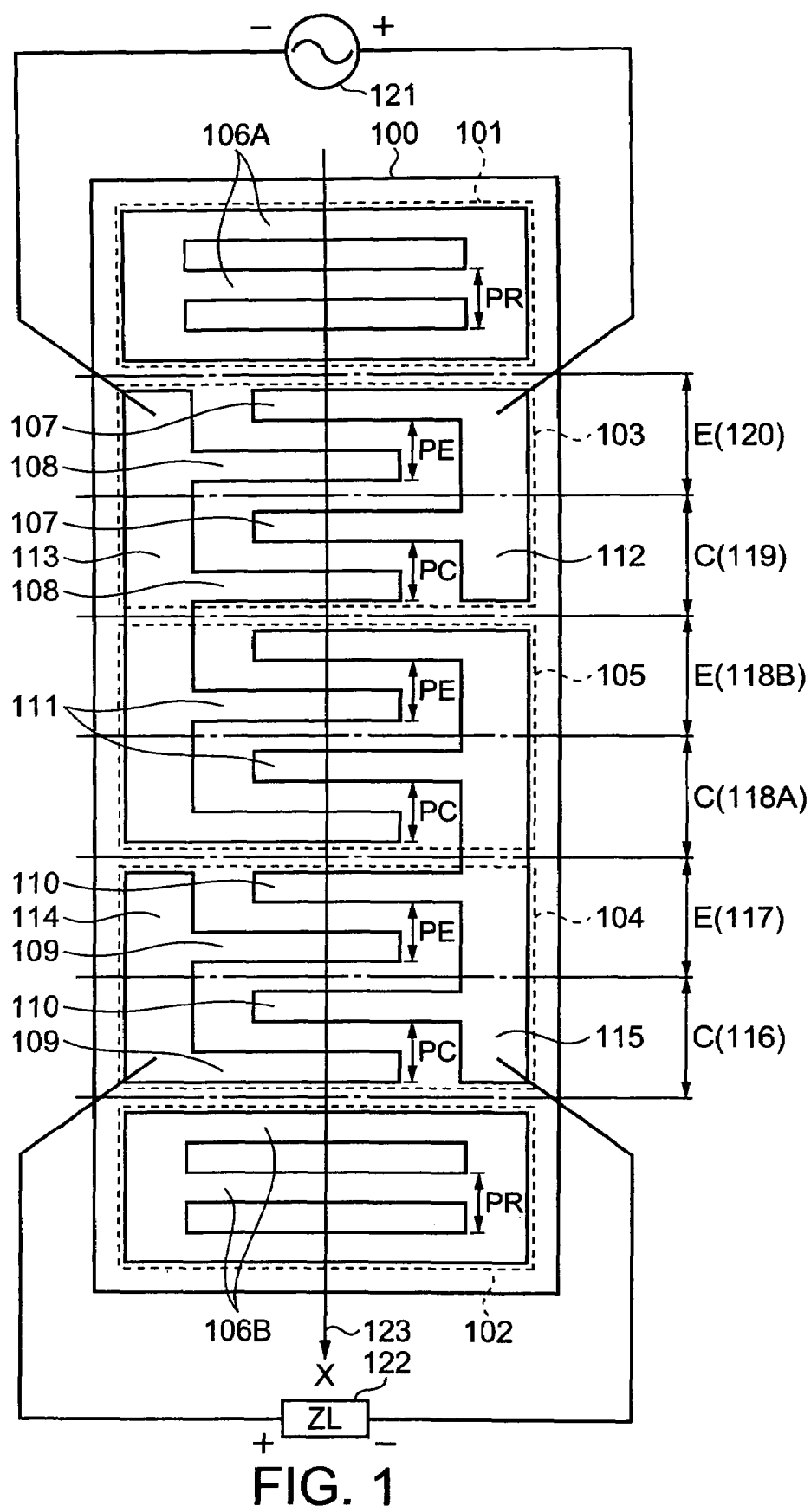
FIG. 1 is a plan view showing a frame format of an electrode pattern of a resonator type SAW filter according to the invention.

FIG. 1 is a plan view showing a frame format of an electrode pattern formed on the piezoelectric substrate in order to explain one embodiment of the resonator type SAW filter (hereinafter, sometimes referred to as an element) according to the invention.

With respect to designation of each of parts in FIG. 1, numeral 100 is a piezoelectric substrate made of a quartz crystal, a LiTaO$_3$, or the like, numerals 101 and 102 are reflectors, numeral 103 is an input interdigital transducer, numeral 104 is an output interdigital transducer, and numeral 105 is a control interdigital transducer. The interdigital transducer is referred to as an IDT for short. Furthermore, numerals 106A and 106B are conductor strips composing reflectors, numeral 107 is a positive electrode finger of the input IDT, connected to a feeder conductor (busbar), numeral 108 is a negative electrode finger of the input IDT, connected to the feeder conductor (busbar), numeral 109 is a positive electrode finger of the output IDT, connected to the feeder conductor (busbar), and numeral 110 is a negative electrode finger of the output IDT, connected to the feeder conductor (busbar). Yet further, numeral 111 is an electrode finger of the control IDT, numerals 112 and 113 are input feeder conductors (busbars) at positive and negative sides, respectively, numerals 114 and 115 are output feeder conductors (busbars) at positive and negative sides, respectively. Numeral 123 is an X-axis aligned with a direction of propagation of the surface acoustic wave. Numeral 121 is a signal source for driving this element, and numeral 122 is an impedance ZL serving as a load on this element.

Numeral 116 is a part of the output IDT 104 corresponding to zone C, numeral 117 is a part of the output IDT 104 corresponding to zone E, numeral 119 is a part of the input IDT 103 corresponding to zone C, and numeral 120 is a part of the input IDT 103 corresponding to zone E. Numerals 118A and 118B are zones of the control IDT 105 corresponding to zones C and E, respectively.

In the actual element, the input IDT 103 is configured by alternatively arranging zones C and E in a row while the output IDT 104 is also configured by alternatively arranging zones C and E in a row. The control IDT 105 is configured by alternatively arranging zones C and E in a row as well. A pair of reflectors 101, 102 is arranged to opposite sides of the input IDT 103 and the output IDT 104 in a direction of the X-axis. The reflectors 101, 102 are not always necessary but existence of those reflectors improves characteristics of the element remarkably.

Figure 2:
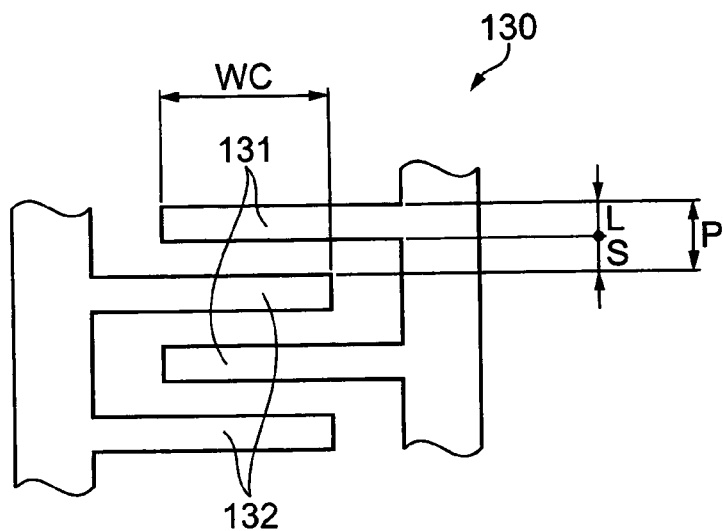
FIG. 2 is an overview diagram defining components of an interdigital transducer according to the invention.

Defined hereinafter are components of the IDT. FIG. 2 is a plan view of a part of the IDT. The IDT 130 is arranged such that the positive electrode finger 131 and the negative electrode finger 132 mesh with each other. Where a width of the electrode fingers 131, 132 is set as L and a spacing between the electrode fingers is set as S, an electrode period length P is defined as P=L+S. An electrode period length of the IDT in zone C is set as PC and an electronic period length of the IDT in zone E is set as PE. In a similar manner, an electrode period length of the conductor strip in the reflector is set as PR.

One positive electrode finger and one negative electrode finger are counted as one pair, and a sum of pairs of the electrode the electrode fingers in the whole of the input and output IDTs is set as M. A number of pairs of the electrode the electrode fingers in zone C is set as MC, a number of pairs of the electrode fingers in zone E is set as ME, and a number of pairs of the electrode fingers in the control IDT is set as MK. A width where the positive electrode finger 131 and the negative electrode finger 132 cross with each other is set as WC, and this electrode finger cross width WC is expressed by multiples of the wavelength $\lambda$ of the surface acoustic wave.

The present embodiment will now be explained in more detail. The number of pairs MC of electrode fingers of the IDT is 1 in zone C while the number of pairs ME of the electrode fingers is 1 in zone E, and the electrode fingers in both of zones C and E are connected to the feeder conductors. This condition where the electrode fingers are connected to the feeder conductors indicates electrical connection. The width L of each of the electrode fingers is set to $\lambda/4$ on the condition that the wavelength of the propagated surface acoustic wave is equal to $\lambda$. Furthermore, a ratio PE/PC of the electrode period lengths in zones C and E is set within a range of 0.8<PE/PC<1.

As described above, to make the resonator type SAW filter according to this invention, a piezoelectric material such as a quartz crystal is sliced into a flat substrate, a surface of the substrate is mirror-polished, and thereafter the input IDT 103 and the output IDT 104 are configured by arranging a number of electrode fingers as parallel conductors made of metallic aluminum or the like in a periodic pattern perpendicular to the direction of phase propagation of the surface acoustic wave such as Rayleigh type, an SSBW type, or the like. Provided between the input IDT 103 and the output IDT 104 is the control IDT 105 for controlling a condition of the surface acoustic wave. The IDTs 103, 104, and 105 are configured by arranging two different zones, zones C and E, alternatively, and the pair of reflectors 101, 102 is arranged on outer sides of both the input IDT 103 and the output IDT 104 to configure a three-longitudinal-mode-coupled resonator type SAW filter.

A relation between the combination of the electrode period lengths PC and PE of the IDTs in zones C and E, and the electrode period length PR is set as f (Ref)=f (IDT) by appropriate adjustment using a center frequency f (Fef) of the reflectors 101, 102 and a frequency f (IDT) generated by the IDTs in zones E.

In the whole structure of FIG. 1 as described above, the pair of the reflectors 101, 102, reflect the surface acoustic wave generated by the input IDT 103 to bring in a standing-wave-vibration condition, thereby generating natural resonance modes to be utilized. Those natural modes are set as the three-resonance condition of a fundamental wave symmetrical mode S0, a fundamental wave anti-symmetrical mode A0, and further, a primary symmetrical mode S1 in which a vibration displacement shifts in the direction of the X-axis, and the three-longitudinal-mode-coupled resonator type SAW filter is configured upon combination of those three resonance phenomena. In this regard, this SAW filter is different from that of the related art in that an equivalent reflection coefficient γce of the surface acoustic wave exhibited by one of electrode fingers provided to the whole of the IDTs composed of the alternatively-arranged zones C and E, falls within a range of 0.01 to 0.025. The reason why the reflection coefficient γce is called an equivalent reflection coefficient is that it is a value converted by dividing by the total number of the electrodes the reflection coefficient of the whole of the IDTs generated because of an array structure of the electrode fingers having different electrode period lengths in zones C and E as described above.

In setup conditions, this invention is effective especially in the case where the reflection coefficient γ of the surface acoustic wave of the piezoelectric plate 100 and one of electrode fingers of the IDTs (103, 104, 105, and the like) falls within a range from 0.03 to 0.1.

In more detailed setup conditions, the piezoelectric plate 100 is an STW cut quartz crystal substrate, the IDT is made of metal such as aluminum and the reflection coefficient γ of the surface acoustic wave exhibited by one of electrode fingers is set to 0.05±0.02, the number of pairs MC of electrode fingers in zone C and the number of pairs ME of electrode fingers in zone E are each set to 1, and the number of pairs MK of the electrode fingers 111 in the control IDT 105 falls within a range from 10 to 30. The electrode fingers in zones C and E are connected to feeder conductors 112, 113, 114, 115, and the sum M of the number of pairs of the electrode fingers in the input IDT 103 and the output IDT 104 is set to 80±10. Especially in the case where MK=20, the number of pairs of the electrode fingers in each of the input and output IDTs is set to 40. The electrode finger cross width WC of the IDT is set to from 50 to 80γ, and the number of conductors of each of the reflectors 101, 102 is set to from 30 to 100. This element obtains good characteristics especially in the cases described above. The STW cut quartz crystal substrate is a quartz crystal plate in which a quartz crystal Y plate is rotated 35 to 38 degrees around an electronic axis (X-axis) in a counterclockwise direction. This STW cut quartz crystal is described as (0 degrees, 125 to 128 degrees, 90 degrees) by Euler angles (φ, θ, ψ). Each of the IDTs is aligned such that a direction of propagation of the surface acoustic wave is set as a direction of the optical axis Z' after rotation of the quartz crystal Y plate.

Figure 3:
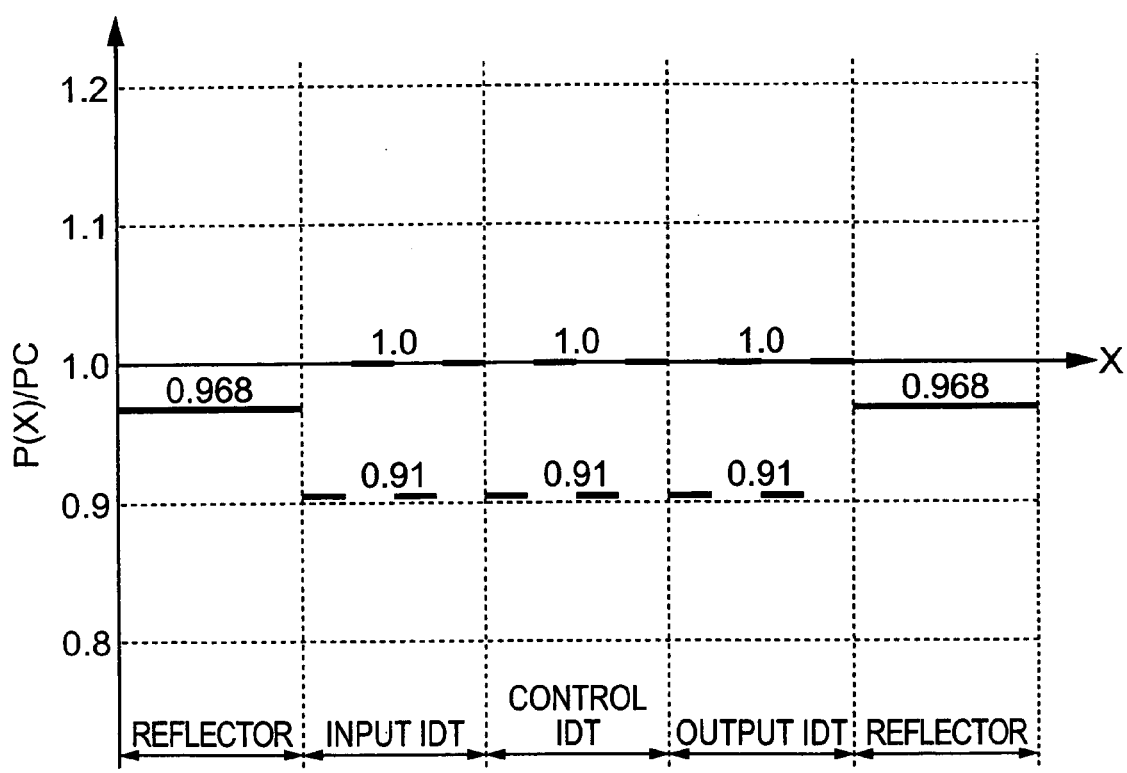
FIG. 3 is a view showing an electrode period length of the resonator type SAW filter according to a first embodiment of the invention.

Shown in FIG. 3 is one example of a detailed setting of the electrode period length P (X) under this setup condition. In FIG. 3, an abscissa axis represents an X coordinate position of the element while an ordinate axis represents a ratio P (X)/PC of P (X) to the electrode period length PC in zone C. Those values are set to 0.968 for the reflectors, 1.0 for the input, output, and control IDTs in zone C, and 0.91 for the input, output, and control IDTs in zone E.

Next, the structure and operation of the element according to this embodiment is explained with reference to FIG. 4.

Figure 4:
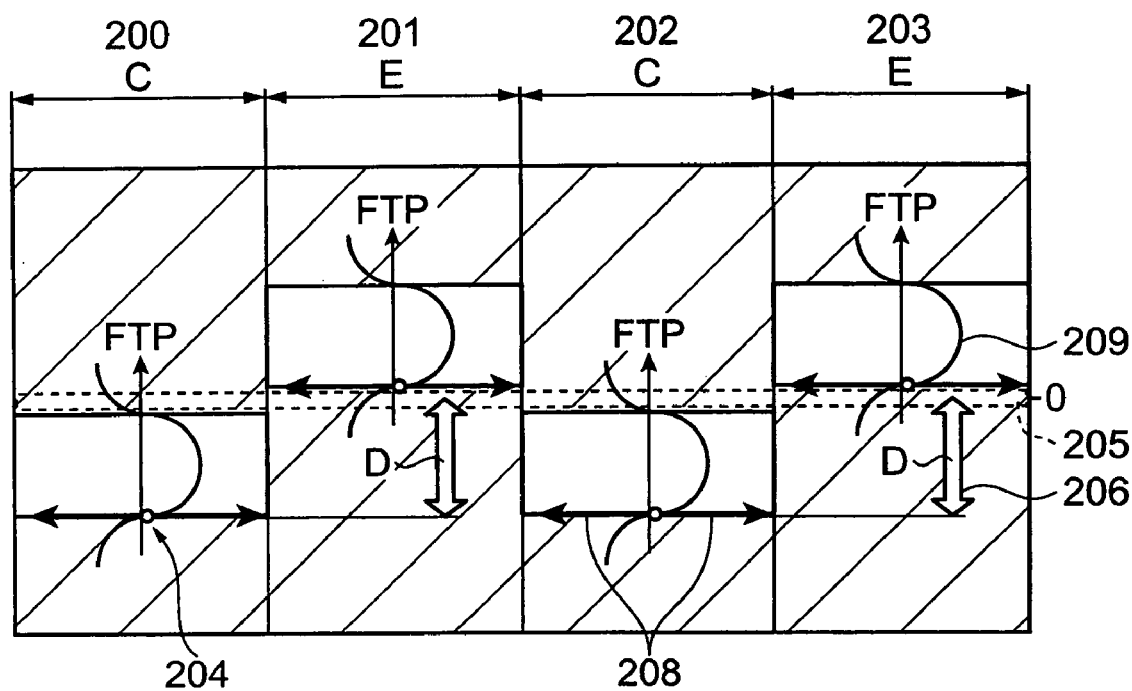
FIG. 4 is an overview diagram illustrating a periodic structure of the resonator type SAW filter according to the invention.

FIG. 4 shows the IDTs with a periodical structure composed of zones C and E as shown in FIG. 1, using the "frequency potential design method". In FIG. 4, numerals 200 and 202 are blocks formed by the aforementioned zones C while numerals 201 and 203 are blocks formed by zones E. Four characteristic curves 209 and the like in FIG. 4 indicate the full characteristics of propagation bands (areas indicated by hatch lines) as a propagation condition of the surface acoustic wave and non-propagation bands (areas indicated by a blank, which is also called a stop band) as a condition where the surface acoustic wave attenuates without propagation.

Those characteristic curves are also called a wavenumber dispersion curve. With respect to the wavenumber dispersion curve, an abscissa axis is set to wavenumber $k=2\pi/\lambda$ (1/m) while an ordinate axis is represented by a frequency FTP (Hz). FTP is short for a "frequency potential" utilized in this invention. In a condition where the surface acoustic wave in use has a speed of Vs, a relation between FTP and the aforementioned electrode period length P is set as FTP=Vs/(2×P). Furthermore, it is effective to set a reference frequency to be FTP0 for the expression of frequency difference quantity D=(FTP−FTP0). White circles 204 and the like represent an operating point of the surface acoustic wave generated by the IDTs, in which a right-propagation wave and a left-propagation wave, which are indicated by an arrow 208, are generated. The frequency difference quantity D indicated by numeral 206 is an indication of a rate of the frequency change and as well as a difference in a frequency potential between zones C and E. In particular, the frequency potential FTPC in zone C is approximately set as FTPC=Vs/(2×PC) while the frequency potential FTPE in zone E is approximately set as FTPE=Vs/(2×PE). Those frequency potentials are in a relation represented by the expression of the frequency difference quantity D=FTPC−FTPE. Furthermore, an area 205 surrounded with dashed lines is a propagation band area having the reflection coefficient γce generated in the structure in FIG. 1 falling within a range from 0 to 0.025. After investigation, it is found out that this element is configured with more than one pair MP (=MC=ME) of electrode fingers of the IDTs in each of zones C and E.

Figure 5:
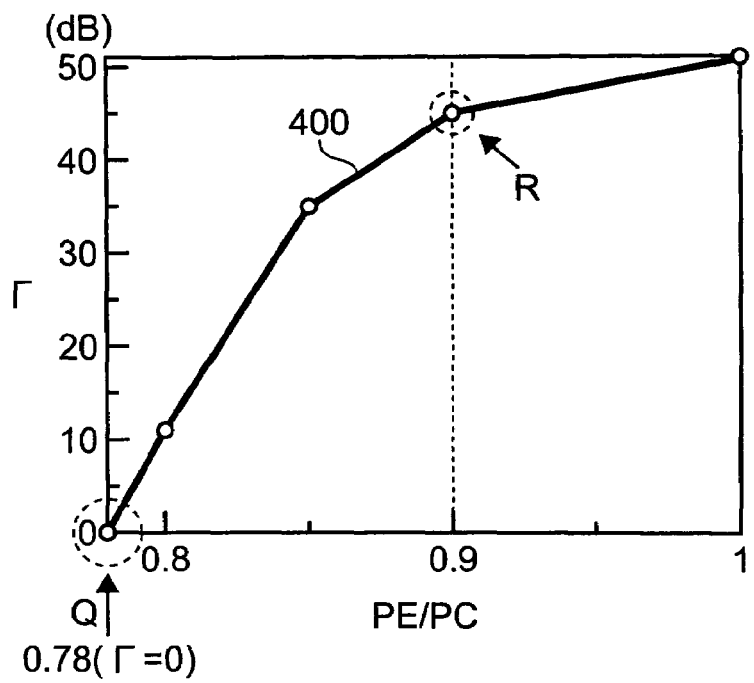
FIG. 5 is a characteristic diagram showing reflection characteristics of the periodic structure of the resonator type SAW filter according to the invention.

Shown in FIG. 5 is a relation between an insertion loss Γ, and a ratio PE/PC of the electrode lengths exhibited by the IDTs, which are obtained from characteristics of a regular-type transversal filter configured using the IDTs with the periodical structure as shown in FIG. 4, in which the reflective coefficient γ is equal to 0.05 per electrode finger. The regular-type transversal filter is an element with a structure that does not contain the reflectors 101, 102 shown in FIG. 1. Furthermore, FIG. 5 shows physical characteristics of a reflection phenomenon of the surface acoustic wave in the IDT with the periodical structure as shown in FIG. 4. As is clear from a characteristic curve 400 in FIG. 5, the insertion loss Γ is approximately 0 at the point where PE/PC is around 0.78±0.02 (point Q). Furthermore, at the point where PE/PC is around 0.9 (point R), it is recognized that the insertion loss is 6 bB less than that of the existing products. Therefore, in a condition where the reflection coefficient γ exhibited by one electrode finger is 0.05, it is estimated that the value becomes approximately half, i.e., about 0.025.

Figure 6:
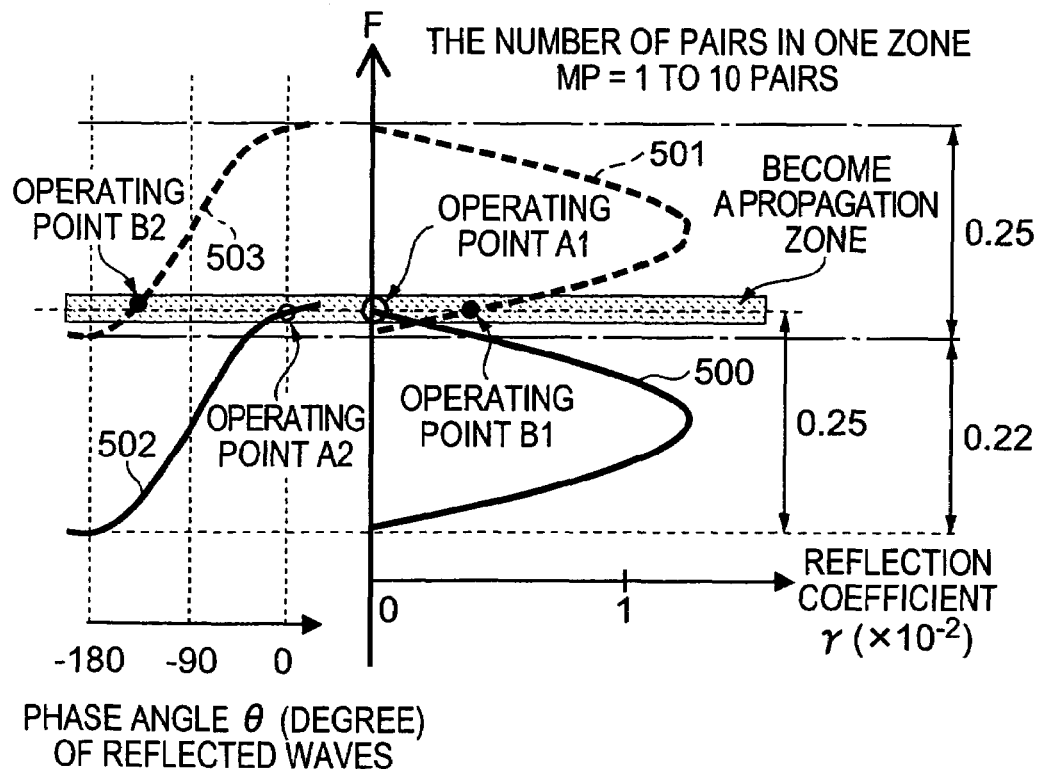
FIG. 6 is an overview diagram illustrating a principle of operation of the resonator type SAW filter according to the invention.

Shown in FIG. 6 is a generating mechanism of the propagation zone area having the reflection coefficient γce equal to 0, which is set as the point Q. An ordinate axis in FIG. 6 is a frequency axis F, and an abscissa axis located at a midpoint on the right side with respect to the frequency axis F represents the measure of the reflection coefficient γ while an abscissa axis located at a midpoint on the left side represents a phase angle θ of the reflection coefficient γ, which corresponds to the phase angle θ of the reflected wave. A characteristic curve 500 in FIG. 6 represents an amplitude characteristic of the reflection coefficient γc in the aforementioned zone C, and numeral 502 is a phase characteristic γc. In the case of a phase equal to 0 degrees, the reflected wave is in the same phase condition as an incident wave. A phase equal to 180 degrees means that the incident wave and the reflected wave are in an antiphase condition. On the other hand, a characteristic curve 501 at a position shifted upwardly by +0.22 from the characteristic curve 500 represents an amplitude characteristic of the reflection coefficient γe in zone E. Furthermore, numeral 503 represents a phase characteristic of the reflective coefficient γe. The electrode fingers in zones C and E are all connected to the feeder conductors to excite the surface acoustic wave. The characteristic curve 500 is determined by making a calculation in the case where the number of pairs of the electrode fingers in zone C with the electrode period length PC and the reflection coefficient γ per electrode finger is 0.05 (which corresponds to FIG. 5). With respect to the characteristic curve 500, the frequency with the reflection coefficient γ equal to 0 indicates that the surface acoustic wave passes, in which the incident wave is not reflected but passes through zone C. In this case, a stop band width BW, which is a distance between propagation points at upper and lower sides, is set to be as wide as 0.25 (25%). This is because the reflection coefficient γ of the electrode finger is large while the number of pairs MP is as small as 4. The characteristic curve 501 is determined by making a calculation in a similar manner in the case where the number of pairs ME of electrode fingers in zone E with the electrode period length PE is 4 and the reflection coefficient gamma per electrode finger is 0.05. The characteristic curve 500 is at a position where the characteristic curve 500 is upwardly raised by 0.22 (22%), and this is because the electrode period length PE is set to 78% of PC. The stop bandwidth BW of the characteristic curve 501 is 0.25 (25%), which is the same as that of zone C. In general, the aforementioned excited surface acoustic wave has frequency components at the vicinities of an amplitude operating point B1 and a phase operating point B2, and this generated surface acoustic wave transmits up to zone S to operate at an amplitude operating point A1 and a phase operating point A2 of the same frequency. The phase operating points A2 and B2 are arranged with approximately reversed phases, and the reflected waves from zones C and E are combined and cancel each other out to set the whole of the reflected waves to 0, enabling the reflection coefficient γce equal to 0. Therefore, the frequency at the vicinities of the operating points B1 and B2 is set as a propagation zone of non-reflection. The descriptions above are explanations for phenomena that are fundamental for this invention. Furthermore, where the amount of rise in the frequency falls within a range of 0 to +0.22, the total reflection coefficient exhibited by a number of zones C and E in a repeated manner is set to a value from 1 to 0. The aforementioned characteristics of FIG. 5 are interpreted as showing this condition. The above explanations are based on the number of pairs MP of electrode fingers, but the same effects can be obtained with MP within a range from 1 to 10.

Zone E excites the surface acoustic wave with the frequency corresponding to the operating point B1 to form filter characteristics of the element according to the invention.

Based on the principle of the operation as described above, this invention enables the equivalent reflection coefficient γce exhibited by one of the electrode fingers provided to the whole of the IDTs in zones C and E to be in a condition within a range of 0.01 to 0.025, resulting in the resonator type SAW filter using the three-resonance condition of the fundamental wave symmetrical mode S0, the fundamental wave anti-symmetrical mode A0, and the primary symmetrical mode S1.

Explained next is the filter characteristics exhibited by the resonator type SAW filter with the structure shown in FIG. 1.

Figure 7:
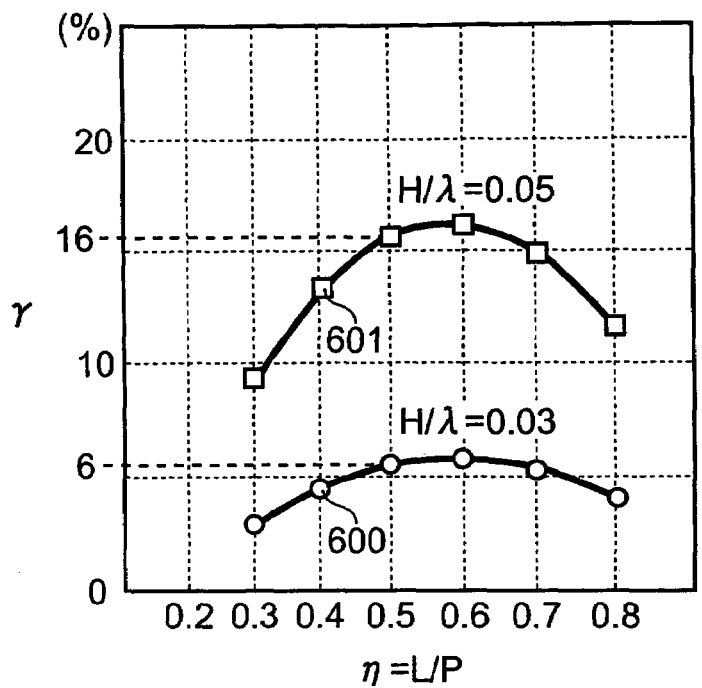
FIG. 7 is a characteristic diagram showing a reflection coefficient γ of an STW cut quartz crystal substrate used for the resonator type SAW filter according to the invention.

FIG. 7 is a characteristic diagram showing the reflection coefficient γ per electrode finger in the STW cut quartz crystal. The STW cut in this characteristic diagram is described as (0 degree, 127±1 degrees, 90 degrees) by Euler angles (φ, θ, ψ) and is operated by the elastic wave called the SH wave as a surface-focused type or the SSBW surface acoustic wave. An abscissa axis in FIG. 7 represents a line width ratio η=L/P, as a ratio of a conductor width L and the electrode period length P in the electrode fingers while an ordinate axis represents a value of the reflective coefficient per electrode finger in percent figures. Numeral 600 is a characteristic curve in the case where a ratio H/λ of a wavelength of the surface acoustic wave to an electrode film thickness H is equal to 0.03 while numeral 601 is a characteristic curve in a case where H/λ is equal to 0.05. For example, in the case of an operating frequency of 1.5 GHz, the wavelength λ is set equal to 5100/1.5×109=3.4×10$^{-6}$ m since the SSBW surface acoustic wave has a speed of about 5100 (m/sec). At this point, the electrode film thickness H is set to 102 nm in the case where H/λ=0.03 while being set to 170 nm in the case where H/λ=0.05. Stable formation of the electrode film requires a film thickness of about 100 nm at least, and the reflection coefficient γ in this condition falls within a range of about 5 to 6%.

Next, FIG. 8 is a conceptual view illustrating a state of the three-longitudinal-mode-coupled resonator type SAW filter configured using the electrode fingers having the aforementioned reflection coefficient on the piezoelectric substrate. Numeral 700 in FIG. 8 is the piezoelectric substrate, numerals 701, 702 are reflectors, numerals 703, 704 are input and output IDTs, and numeral 705 is an area for the control IDT. Those are configured by alternatively arranging zones C and E. Shown in this condition is a relative value of vibration displacement distribution U (X) in a natural mode which is utilized for the aforementioned element and corresponds to an X-axis position of the element. Numeral 706 is a fundamental wave symmetrical mode S0 with a vibration displacement distribution that is generally symmetrical with respect to a center position. Numeral 707 is a fundamental wave anti-symmetrical mode A0 with a vibration displacement distribution which is generally anti-symmetrical with respect to the center position. Numeral 708 is a primary symmetrical mode S1 having two nodes in a vibration displacement amplitude which is generally symmetrical with respect to the central position. Herein, the X coordinate in the abscissa axis is described in ½-wavelength units.

Herein, the obtained filter characteristics described by related art is explained so as to facilitate understanding of characteristics of the filter according to this embodiment.

FIG. 9 illustrates the case where the electrode period lengths PC and PE in zones C and E are equalized (PE/PC=1), which is the condition of related art, with a design variable, which is defined in this embodiment, set to H/λ equal to 0.03 and the reflection coefficient γ per electrode finger equal to 0.05. In this case, the number of pairs MP of fingers in one zone is equal to 4, the sum of pairs M of electrode fingers in the whole of the input and output IDTs is set to 120, the number of pairs MK of the electrode control electrode fingers is set to 20, the number of conductors of the reflectors is set to 80, and the electrode finger cross width WC of electrode fingers is set to 50λ. The abscissa axis in FIG. 9 indicates a rate of frequency change df/f (ppm) while the ordinate axis represents an operation transmission quantity SB (f) in digital (dB) form. Herein, f represents a frequency. With respect to a characteristic curve 800, numeral 801, which indicates a peak, indicates a passband width of the filter. As is clear from FIG. 9, a band characteristic is unimodal and narrow. This invention is intended to provide a means for setting a wide passband width by improving this unimodal characteristic.

Figure 10A:
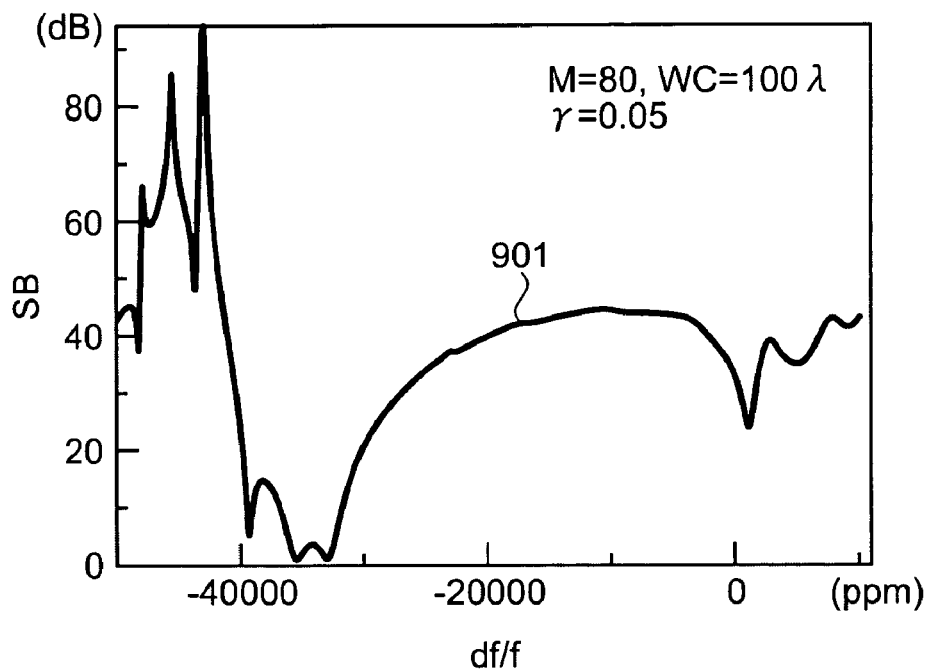
FIGS. 10A and 10B are each characteristic diagram showing another transmission characteristic of the resonator type SAW filter according to related art.

Next, FIG. 10 shows the case on the existing design condition (PE/PC=1), in which transmission characteristics of the filter are calculated in the case of changing the value of the reflection coefficient γ per electrode finger. FIG. 10A shows the case of the reflection coefficient γ equal to 0.05, in which the number of pairs M of the electrode fingers in the whole of the input and output IDTs is equal to 80, the electrode finger cross width WC is equal to 100λ, the number N of the conductors of the reflectors is equal to 80, and the number of pairs MP of electrode fingers per zone is equal to 4. In this case, a characteristic curve 901 represents transmission characteristics of the filter, and the passband width of the passband is set to 1200 ppm.

Figure 10B:
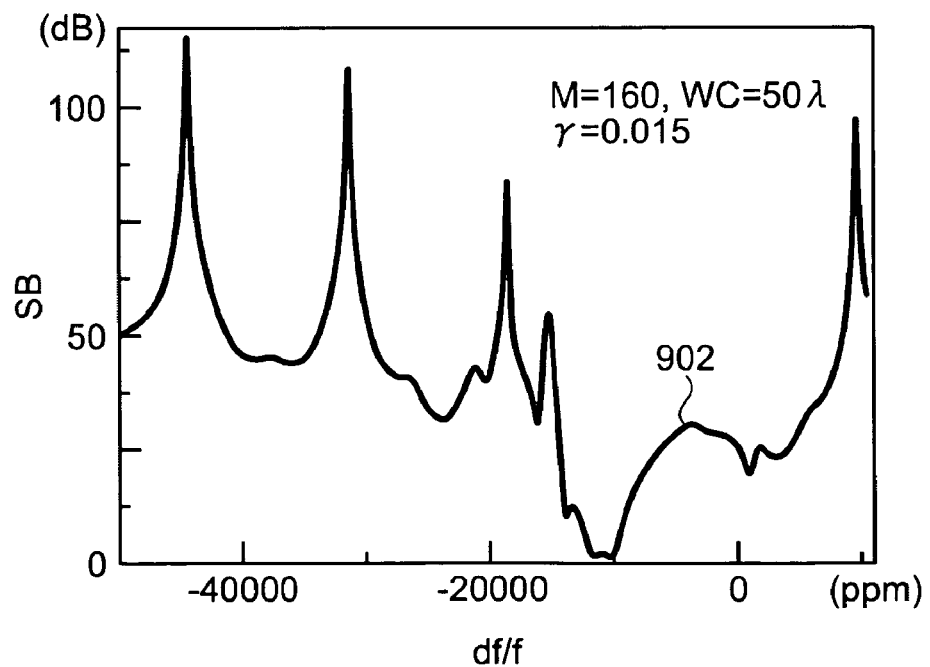

Furthermore, FIG. 10B shows the case of the reflection coefficient γ equal to 0.015, in which the sum M of the number of pairs of the electrode fingers in the whole of the input and output IDTs is set to be twice, i.e., 160, the electrode finger cross width WC is equal to 50λ, the number N of the conductors of the reflectors is equal to 80, and the number of pairs MP of electrode fingers per zone is equal to 4. In this case, a characteristic curve 902 represents the transmission characteristics of the filter, and the passband width of the passband is set to approximately 1000 ppm. By FIG. 10, it is meant that the passband width is widened by setting the sum M of the number of the electrode fingers in the whole of electrodes in the input and output IDTs to be small and that the passband width is widened even in the case where the sum M of the number of pairs of the electrode fingers in all of the input and output IDTs is large, as long as the reflection coefficient γ is small. This invention realizes the resonator type SAW filter with the passband width of 4000 ppm, which operates in a band from 1 to 3 GHz, by utilizing this conclusion, i.e., by setting the sum M of the number of electrode fingers in all of the input and output IDTs and by setting the reflection coefficient γ to a small number. With related art, the passband width is limited to about 500 ppm, as described above. This is because the reflection coefficient γ per electrode finger falls within a range of 5 to 10% with the practical electrode film thickness.

Explained next is the filter characteristics exhibited by the embodiment shown in FIG. 1.

Figure 11:
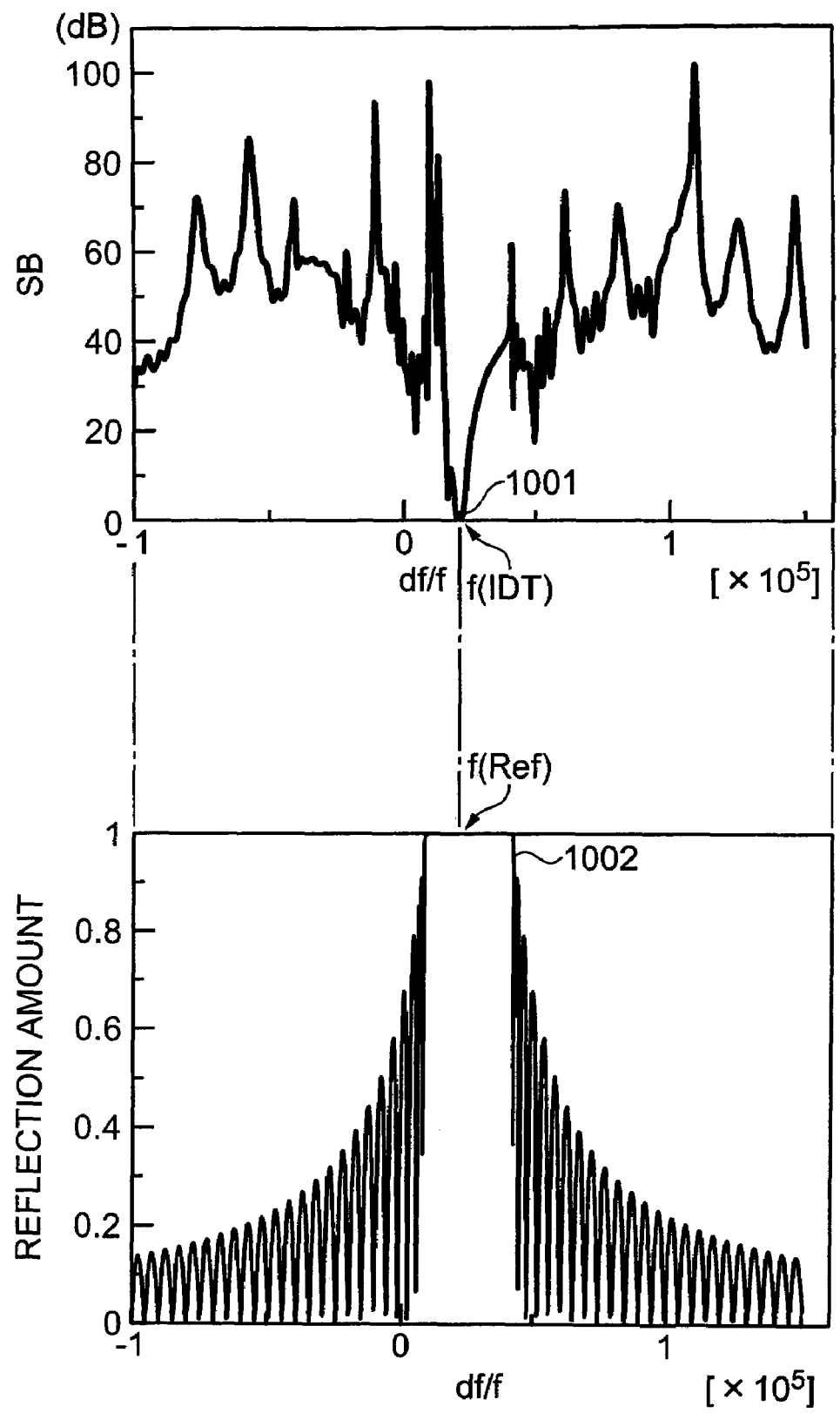
FIG. 11 is a characteristic diagram of the resonator type SAW filter according to the first embodiment of the invention.

FIG. 11 illustrates a transmission characteristic 1001 of the filter in an upper area while illustrating a transmission characteristic 1002 of the reflectors composing this element in a lower area. In this invention, the center frequency f (Ref) of the reflectors and the center frequency f (IDT) of the passband width of the filter are equalized. In such a condition, the surface acoustic wave radiating from the IDT in zone E can be completely reflected, thereby enabling the number of the conductors of the reflectors to be decreased. Therefore, the electrode period length PR is set to 0.986 PC. As other conditions, PE/PC is equal to 0.91, the number of the pairs of each of the input and output IDTs is 40, the number N of the conductors of the reflectors is equal to 100, the electrode finger cross width WC is equal to 60λ, the number of the pairs MC=ME of the electrode fingers in zones C and E is set to 1, the electrode fingers of the control IDTs is set to 20, and the reflection coefficient γ per electrode finger is set to 0.05.

Figure 12A:
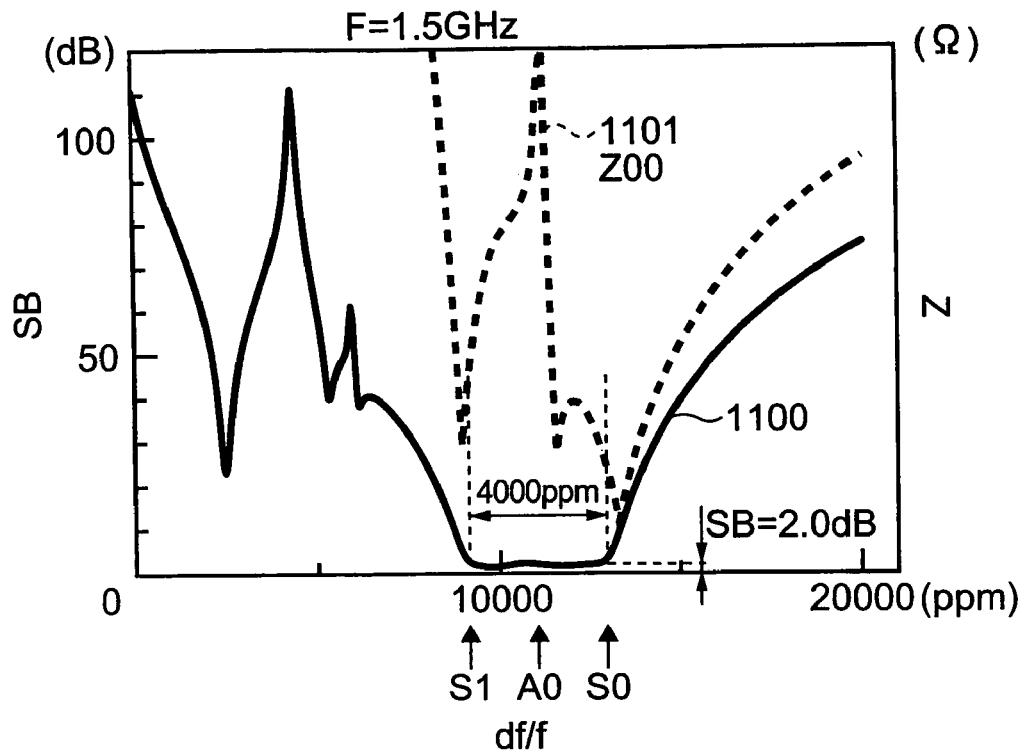
FIGS. 12A and 12B are each characteristic diagram showing another transmission characteristic of a two-longitudinal-mode-coupled resonator type SAW filter according to the first embodiment of the invention.
Figure 12B:
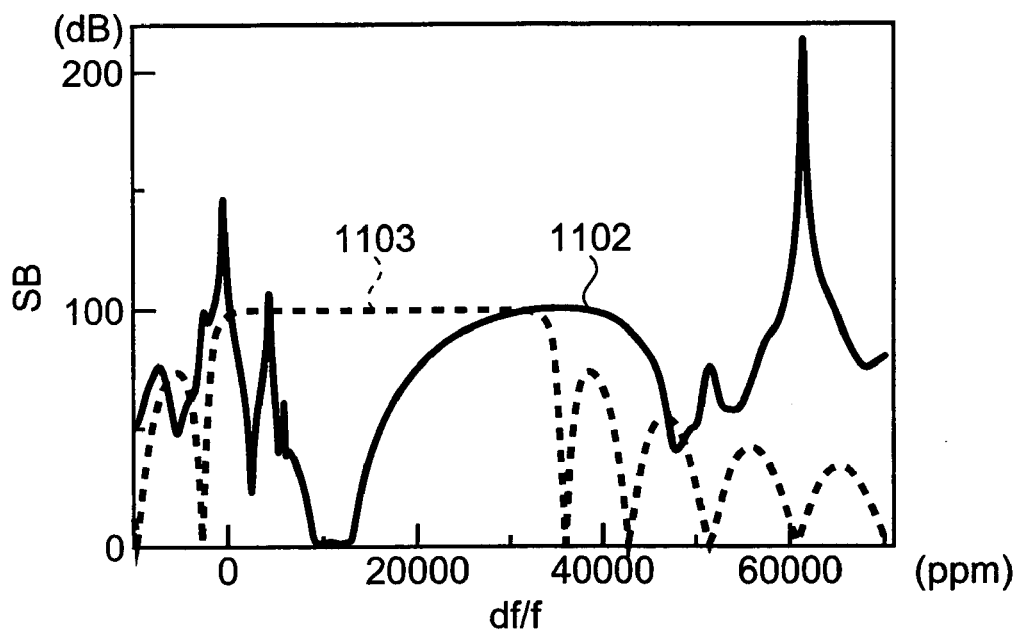

Next, FIG. 12 shows the operation transmission quantity SB(f) of the filter in digital form in the case where two three-longitudinal-mode-coupled resonator type SAW filters in FIG. 11 are connected in serial. The abscissa axis represents the rate of the frequency change df/f (ppm) while the ordinate axis represents the operation transmission quantity SB (f). This element is designed in a manner that the impedance of the filter is set to 50Ω. The operation frequency of this element is set to 1.5 GHz. In this case, the transmission characteristic is represented by a characteristic curve 1100 in FIG. 12A, the minimum value of the insertion loss is set to approximately 2.0 dB, and a width of a flat area (a fractional band) as a passband of about 4000 ppm is obtained. Numeral 1101 represents an image impedance Z (f) (Ω) of the filter. With respect to the characteristic curve 1100, the primary symmetrical mode S1 is set to the approximate frequency of 9000 ppm, the fundamental wave anti-symmetric mode A0 is set to the approximate frequency of 12000 ppm, and the fundamental wave symmetrical mode S0 is set to the approximate frequency of 14000 ppm. FIG. 12B shows filter characteristics that are illustrated in the condition where a frequency range is widened. A suppression characteristic out of a band is ensured approximately 50 dB except the partial narrow frequency, so that the excellent characteristics are achieved. Furthermore, numeral 1103 represents reflection characteristics of the reflectors, which are illustrated in a manner to make a relative position obvious by centuplicating the reflection amount.

The above description was an explanation for this embodiment in regard to the first problem. Next explained is an improved result toward the secondary problem concerning the generation of sideband wave components, which result from this embodiment. As a result of an analysis concerning a generation cause of this sideband wave, it turned out that there are two factors causing the sideband wave generation. A first cause is amplitude modulation resulting from the presence or absence of the amplitude of the surface acoustic wave in zones C and E for the input IDT. A second cause is frequency modulation resulting from differences between the electrode period lengths PC and PE in zones C and E. A condition shown in FIG. 13 is explained from the viewpoint of those generation causes of the sideband wave component.

Figure 13A:
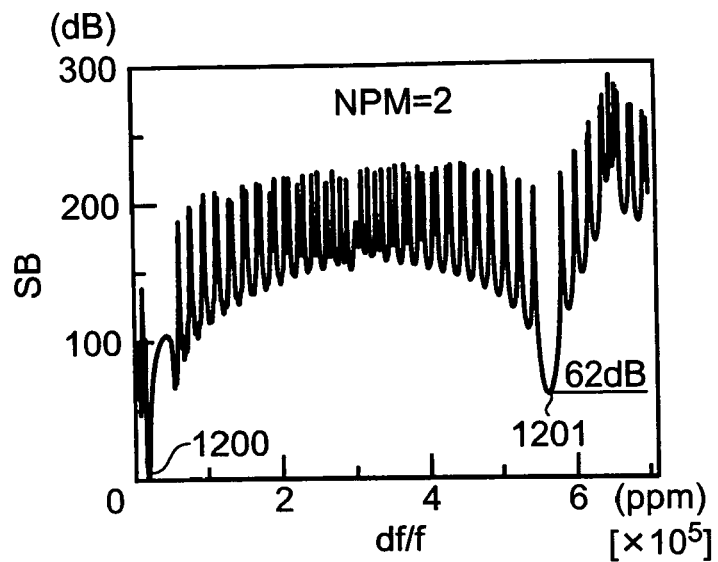
FIGS. 13A, 13B and 13C are each characteristic diagram showing a transmission characteristic indicating a sideband wave component at the time of longitudinal coupling of two resonator type SAW filters.
Figure 13B:
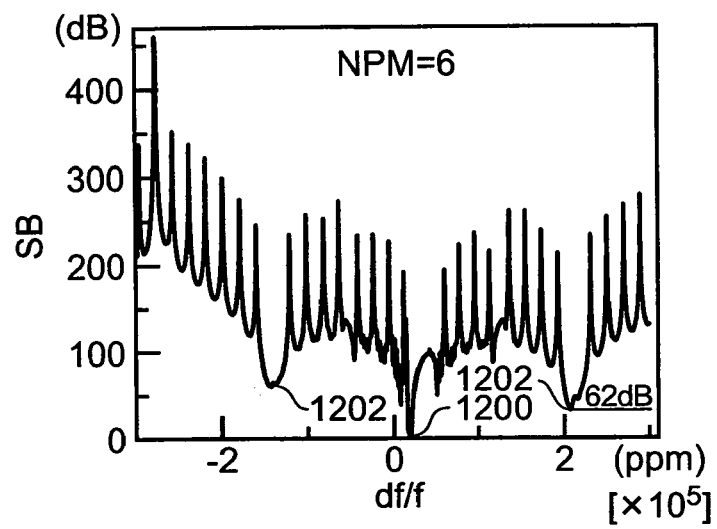
Figure 13C:
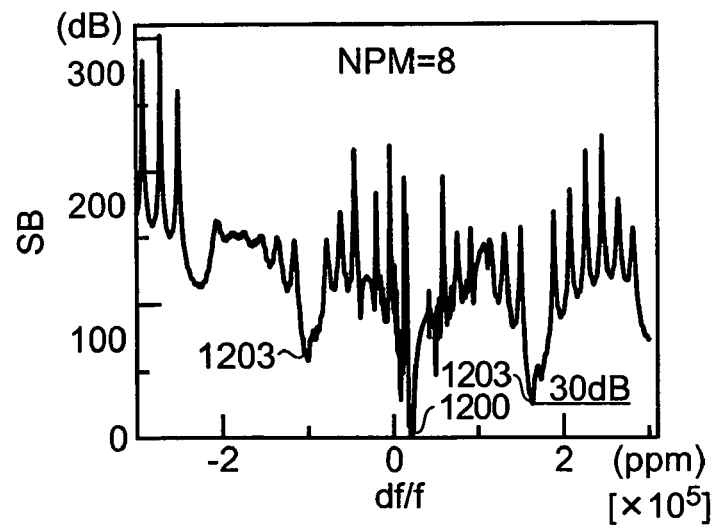

FIG. 13 shows a generation state of the sideband wave in the case where the electrode fingers in zone E are connected to the feeder conductors and the electrodes in zone C are connected to the feeder conductors while the number NPM of the electrode fingers in zones C and E is varied. FIG. 13A shows the case where NPM is equal to 2, FIG. 13B shows the case where NPM is equal to 6, and FIG. 13C shows the case where NPM is equal to 8. Numeral 1200 in FIGS. 12A to 12C represents the desired passband, and each peak 1201, 1202, and 1203 represents the sideband wave component corresponding to each of the numbers NPM of the electrode fingers. The width of those amplitudes is as wide as from 62 dB to 30 dB, resulting in problems. NPM of even-numbered values are shown, but those of odd-numbered results showed similar values for the sideband wave component. In FIG. 13, the sideband wave component is small in the case where NPM is set to 2 or 6, resulting in the amplitude width of 62 dB. In the case where NPM is equal to 2, i.e., MC=ME=1, the sideband wave component is far away from the desired passband 1200, thereby resulting in characteristic advantage over the case of NPM equal to 6 and NPM equal to 8, from a practical viewpoint.

Figure 14:
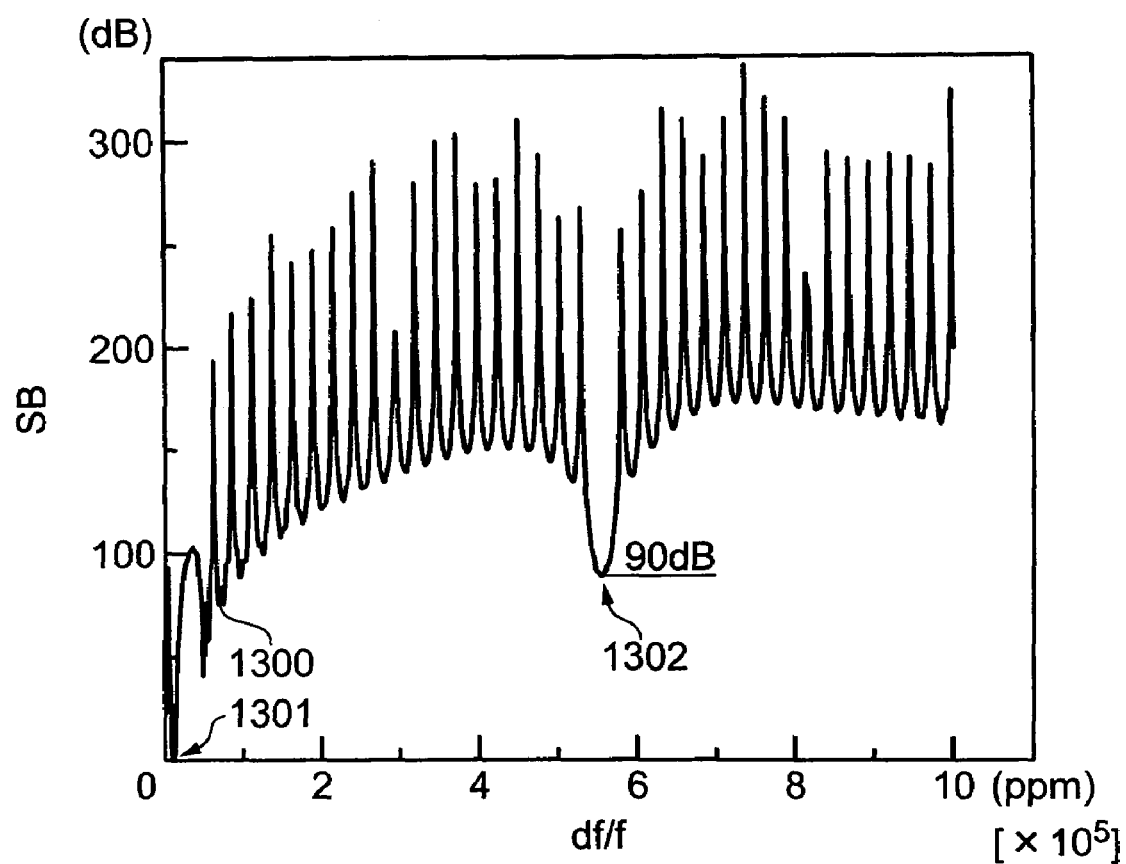
FIG. 14 is a characteristic diagram showing a transmission characteristic indicating a sideband wave component at the time of longitudinal coupling of two resonator type SAW filters according to the invention.

The first generation cause of the sideband wave component is eliminated next. In particular, the electrode fingers in zone C are connected to the feeder conductors. As a result, the filter characteristics indicated by the characteristic curve 1300 shown in FIG. 14 is obtained in the condition where NPM equal to 2. Numeral 1301 in FIG. 14 represents the desired passband while numeral 1302 represents the sideband wave component. The amplitude width is in a normal noise level of 90 dB, which proves that the width is improved to usable size.

As described above, according to this embodiment, the three-longitudinal-mode-coupled resonator type SAW filter with the wide bandwidth can be easily realized by decreasing the effective reflection coefficient per electrode finger such that the sums of the reflected waves from the electrode fingers in zones C and E, respectively, are decreased by canceling each other out. Furthermore, since the electrode fingers in zones C and E are electrically connected to excite the surface acoustic waves in a continuous manner, the sideband wave as the generation cause of the noise can effectively be minimized.

Second Embodiment

Figure 15:
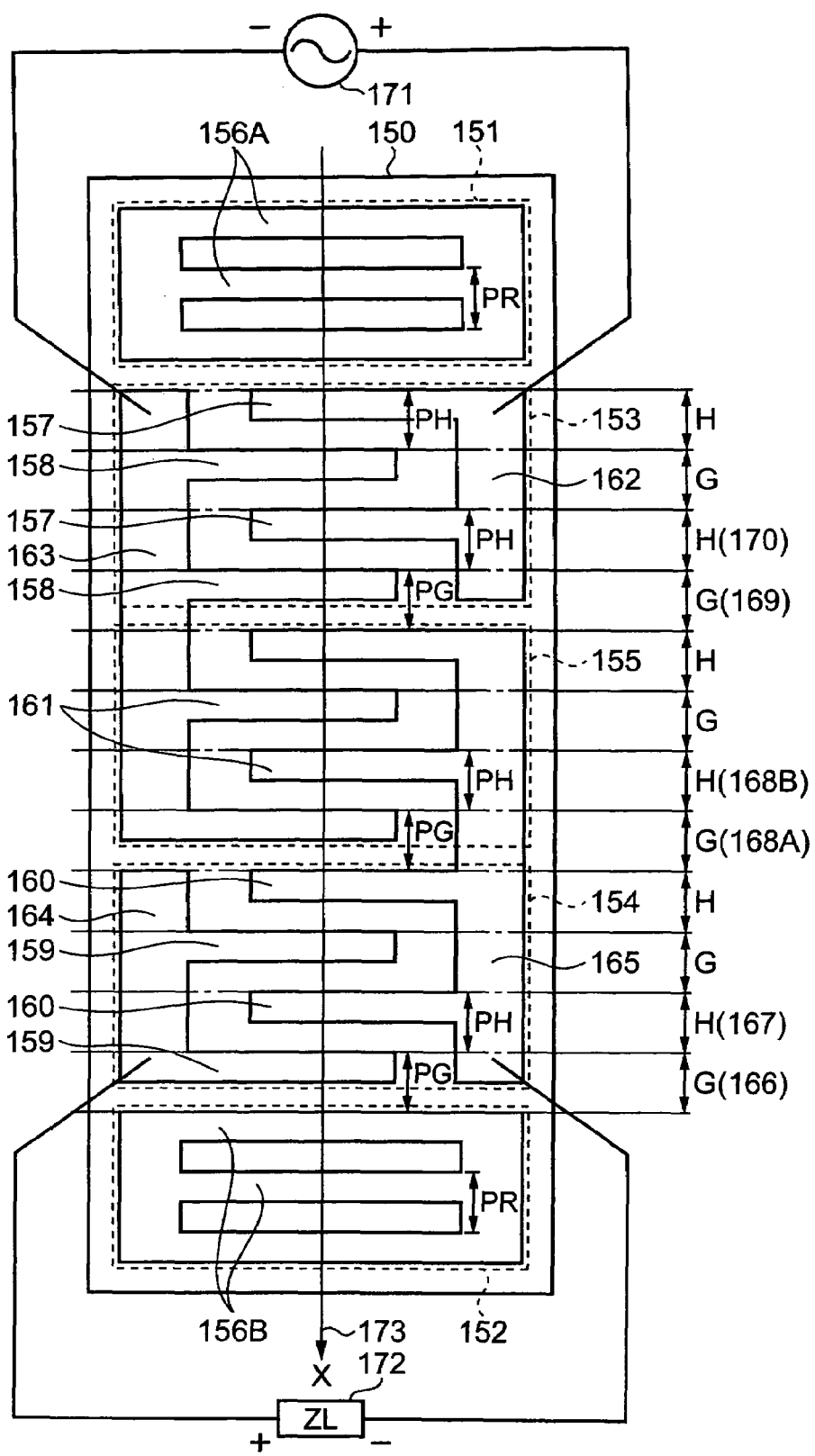
FIG. 15 is a plan view showing a frame format of an electrode pattern of a resonator type SAW filter according to a second embodiment of the invention.

Explained next is another embodiment of the resonator type SAW filter according to the present invention. FIG. 15 is a plan view showing a frame format of an electrode pattern of a resonator type SAW filter according to another embodiment of the invention.

With respect to designation of each of the parts in FIG. 15, numeral 150 is a piezoelectric substrate made of a quartz crystal, a $LiTaO_3$, or the like, numerals 151 and 152 are reflectors, numeral 153 is an input IDT, numeral 154 is an output IDT, numeral 155 is a control IDT, numerals 156A and 156B are conductor strips composing reflectors, numeral 157 is a positive electrode finger of the input IDT, connected to the feeder conductor (busbar), numeral 158 is a negative electrode finger of the input IDT, connected to the feeder conductor (busbar), numeral 159 is a positive electrode finger of the output IDT, connected to the feeder conductor (busbar), and numeral 160 is a negative electrode finger of the output IDT, connected to the feeder conductor (busbar). Yet further, numeral 161 is an electrode finger of the control IDT, numerals 162 and 163 are input feeder conductors (busbars) at positive and negative sides, respectively, numerals 164 and 165 are output feeder conductors (busbars) at positive and negative sides, respectively. Numeral 173 is an X-axis aligned with a direction of propagation of the surface acoustic wave. Numeral 171 is a signal source for driving this element, and numeral 172 is an impedance ZL acting as a burden on this element.

Numeral 166 is a part of the output IDT corresponding to a zone G, numeral 167 is a part of the output IDT corresponding to a zone H, numeral 169 is a part of the input IDT corresponding to a zone G, and numeral 170 is a part of the input IDT corresponding to a zone H. Numerals 168A and 168B are zones of the control IDT with the electrode period lengths PG and PH, respectively.

In the actual element, the input IDT 153 is configured by alternatively arranging zones G and H in a row while the output IDT 154 is also configured by alternatively arranging zones G and H in a row. The control IDT 155 is configured by alternatively arranging zones G and H in a row as well. The pair of reflectors 151, 152 is arranged on outer sides of both the input IDT 153 and the output IDT 154 is arranged in a direction of the X-axis. The reflectors 151, 152 are not always necessary but existence of those reflectors 151, 152 improves characteristics of the element remarkably.

In particular, the number NG of either the positive or negative electrode composing the IDT in zone G is 1 while the number NH of the electrode fingers with the polarity opposite to that of the electrode finger in zone G is 1 in zone H. Furthermore, both of the electrode fingers in zones G and H are connected to the feeder conductors. In the case where the electrode period length P as a sum of an electrode width dimension L and a dimension S between the electrode fingers is equal to L+S, the electrode period length P is set as PG in zone G while the electrode period length P is set as PH in zone H. With respect to the electrode period length, a ratio PH/PG of the electrode period lengths in zones G and H is set within a range of $0.8<PH/PG<1$.

The center frequency f (Ref) of the reflectors 151, 152 and the frequency f (IDT) generated from the IDT in zone H are equalized. Both of the frequencies are set to f (Ref) equal to f (IDT) by setting a relation appropriate between a combination of the electrode period lengths PG and PH of the IDTs in zones G and H and the electrode period length PR of the reflectors 151, 152.

In the whole structure of FIG. 15 as described above, the pair of the reflectors 151, 152, reflect the surface acoustic wave generated by the input IDT to bring in a standing-wave-vibration condition, thereby generating natural resonance modes to be utilized. Those natural modes are set as the three-resonance condition of the fundamental wave symmetrical mode S0, the fundamental wave anti-symmetrical mode A0, and further, the primary symmetrical mode S1 in which a vibration displacement shifts in the direction of the X-axis, and the three-longitudinal-mode-coupled resonator type SAW filter is configured upon combination of those three resonance phenomena.

In this regard, this SAW filter is different from that of the related art in that an equivalent reflection coefficient γgh of the surface acoustic wave exhibited by one of electrode fingers provided to the whole of the IDTs composed of the alternatively-arranged zones G and H, falls within a range of 0.01 to 0.025.

In setup conditions, this invention is effective especially in the case where the reflection coefficient γ of the surface acoustic wave of the piezoelectric plate 150 and one of electrode fingers of the IDTs (153, 154, 155, and the like) falls within a range of 0.03 to 0.1.

In more detailed setup conditions, the piezoelectric plate is the STW cut quartz crystal substrate, the IDT is made of metal such as aluminum and the reflection coefficient γ of the surface acoustic wave exhibited by one of electrode fingers is set to 0.05±0.02, the number MG of electrode fingers in zone G and the number MH of electrode fingers in zone H are each set to 1, and the number of pairs MK of the electrode fingers 161 in the control IDT 155 falls within a range of 10 to 30. The electrode fingers in zones G and H are connected to feeder conductors, and the sum M of the number of pairs of the electrode fingers 161 in the control IDT 155 is set to 40±10. Especially in the case of MK=20, the number of pairs of the electrode fingers in each of the input and output IDTs is set to 40. This element obtains good characteristics in the case where the electrode finger cross width WC of the IDT is set to from 50 to 80γ, and the number of conductors of the reflectors is set to a range of 30 to 100. The STW cut quartz crystal substrate is a quartz crystal plate in which a quartz crystal Y plate is rotated 35 to 38 degrees around an electronic axis (X-axis) in a counterclockwise direction. This STW cut quartz crystal is described as (0 degree, 125 to 128 degrees, 90 degrees) by Euler angles (φ, θ, ψ). Each of the IDTs is aligned such that a direction of propagation of the surface acoustic wave is set as a direction of the optical axis Z' after rotation of the quartz crystal Y plate.

The principle of the operation of the resonator type SAW filter is the same as that explained with reference to FIGS. 2, 3, 4, 5, 6, and 8 according to the first embodiment, thereby omitting the explanation thereof. This embodiment obtains the same result with respect to the filter characteristics as that were explained with reference to FIGS. 7, 11, and 21.

The first embodiment and the second embodiment are different in the number of the electrode fingers composing the IDTs in zones G and H. One zone (zones C and E) is configured by two electrode fingers (NPM=2), i.e., by one pair, in the first embodiment while one zone (zones G and H) is configured by one electrode finger (NPM=1).

Figure 16:
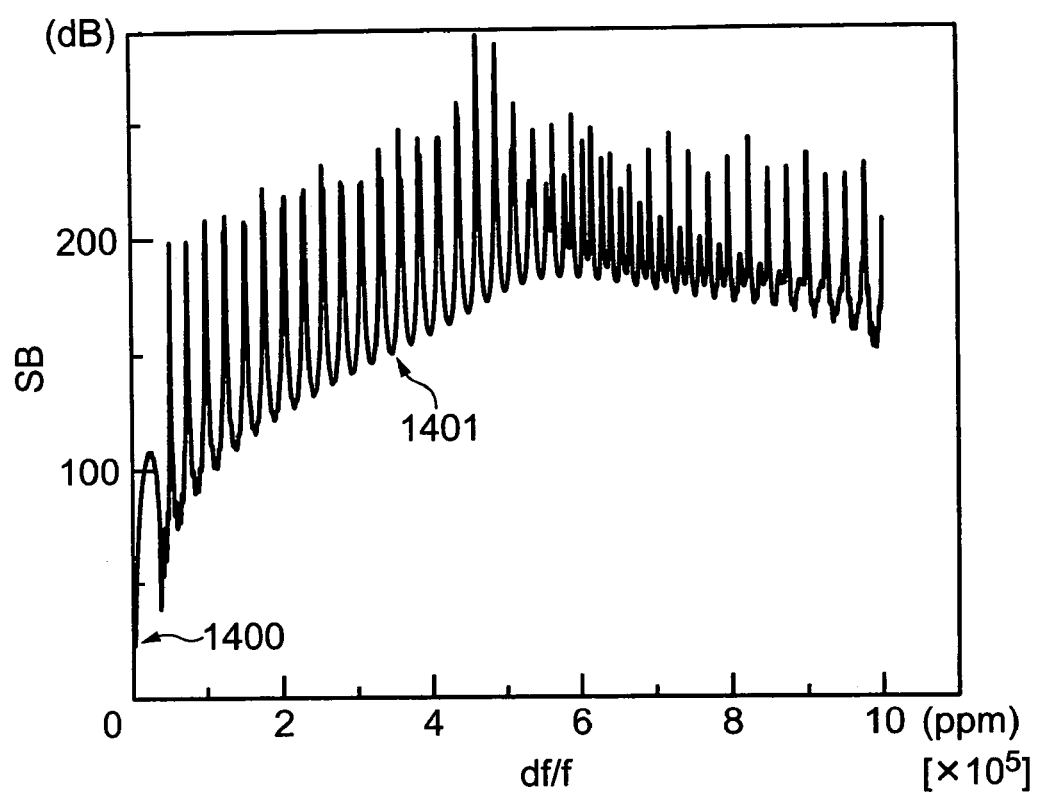
FIG. 16 is a characteristic view showing a transmission characteristic indicating a sideband wave component at the time of longitudinal coupling of two resonator type SAW filter according to the invention.

In the case of one pair of the electrode fingers in one zone, as explained with reference to FIG. 14, the sideband wave component of 90 dB remains in the filter characteristics. As a result of further investigation, it turned out that the sideband wave component becomes nonexistent in the case where the number of the electrode fingers in one zone is set to 1 (NPM=1 rather than in a pair. This state corresponds to the structure shown in FIG. 15, and the transmission characteristics in the case where two the resonator type SAW filter are connected in serial. In FIG. 16, numeral 1400 represents the desired passband while numeral 1401 represents a transmission characteristic curve. As is clear from FIG. 16, the sideband wave becomes nonexistent.

As described above, according to this embodiment, the sums of the reflected waves from the electrode fingers in zones G and H, respectively, are decreased by canceling each other out, so that the three-longitudinal-mode-coupled resonator type SAW filter with the wide bandwidth can be easily realized by decreasing the effective reflection coefficient per electrode finger. Since the electrode fingers in zones G and H are electrically connected to excite the surface acoustic waves in a continuous manner, the sideband wave as the generation cause of the noise can be totally eliminated The structures and characteristics of the surface acoustic wave filter using the STW type surface acoustic wave are explained in the above description, with reference to the substrate made of a quartz crystal only. However, the substrate may be made of material other than the quartz crystal, such as diamond. In addition, even substrate having a surface thereof, which is provided with a thin film made of $SiO_2$, ZnO, or the like to an extent that does not damage the characteristics of the element is effective as long as it is in a range where the structural conditions of this invention are satisfied.

The embodiments above described are explained with reference to the three-longitudinal-mode-coupled resonator type SAW filter as an example but can be implemented as the two-longitudinal-mode-coupled resonator type SAW filter.

The invention claimed is:

1. A resonator type SAW filter comprising, on a piezoelectric substrate in a direction of propagation of a surface acoustic wave:
    an input interdigital transducer that excites the surface acoustic wave;
    an output interdigital transducer that receives the surface acoustic wave excited by the input interdigital transducer;
    a control interdigital transducer interposed between the input interdigital transducer and the output interdigital transducer that controls a state of the surface acoustic wave; and
    a pair of reflectors arranged on outer sides of both the input interdigital transducer and the output interdigital transducer, wherein
    the input interdigital transducer, the output interdigital transducer, and the control transducer are composed of electrode fingers each arranged inside two different zones C and E that are alternatively arranged;
    the electrode finger is formed with a width L set to approximately $\lambda/4$ on the condition of a wavelength of the surface acoustic wave set to $\lambda$;
    an electrode period length P is set as PC and a number of pairs MC of the electrode fingers is set to 1 in zone C and the electrode period length P is set as PE and a number of pairs ME of the electrode fingers is set to 1 in zone E on the condition that electrode period length P as a sum of the width L of the electrode finger and a spacing between the electrode fingers is equal to L+S; and
    a ratio PE/PC of the electrode period lengths in zones C and E falls within a range of 0.8<PE/PC<1; and
    the electrode fingers arranged in zones C and E are all connected to a feeder conductor.

2. The resonator type SAW filter according to claim 1, wherein a reflection coefficient $\gamma$ of the surface acoustic wave exhibited by one of the electrode fingers generated by the piezoelectric substrate and the interdigital transducers falls within a range from 0.03 to 0.10.

3. The resonator type SAW filter according to claim 1, wherein a resonance mode to be utilized is a three-longitudinal-mode combined based on a resonance phenomenon of a fundamental wave symmetrical mode S0, a fundamental wave anti-symmetric mode A0, and a primary symmetrical mode S1; and wherein an equivalent reflection coefficient $\gamma ce$ of the surface acoustic wave exhibited by one of the electrode fingers provided to the whole of the interdigital transducers that are configured by alternatively arranging the electrode period lengths PC and PE falls within a range from 0.01 to 0.025.

4. The resonator type SAW filter according to claim 1, wherein the piezoelectric plate is a STW cut quartz crystal substrate; the interdigital transducer is made of aluminum metal; the reflection coefficient $\gamma$ of the surface acoustic wave exhibited by one of the electrode fingers is set to 0.05±0.02; the ratio PE/PC of the electrode period lengths is set to 0.9±0.02; a number of pairs MK of the electrode fingers of the control interdigital transducer falls within a range from 10 to 30; a sum M of the electrode fingers of the input interdigital transducer and the output interdigital transducer is set to 80±10; an electrode cross width WC of the electrode finger is set to from 50 to 80$\lambda$; and a number of conductors of the reflectors is set to from 30 to 100.

5. The resonator type SAW filter according to claim 4, wherein the STW cut quartz crystal substrate is a quartz crystal plate having a quartz crystal Y plate rotated $\theta$ equal to from 35 to 38 degrees around an electronic axis (X axis) in a counterclockwise direction.

6. The resonator type SAW filter according to claim 1, wherein a center frequency f (Ref) of the reflector and a frequency f (IDT) generated by the interdigital transducer with the electrode period length PE are equalized.

7. A resonator type SAW filter comprising, on a piezoelectric substrate in a direction of propagation of a surface acoustic wave:
    an input interdigital transducer that excites the surface acoustic wave;
    an output interdigital transducer that receives the surface acoustic wave excited by the input interdigital transducer;
    a control interdigital transducer interposed between the input interdigital transducer and the output interdigital transducer that controls a state of the surface acoustic wave; and
    a pair of reflectors arranged on outer sides of both the input interdigital transducer and the output interdigital transducer, wherein
    the input interdigital transducer, the output interdigital transducer, and the control transducer are composed of electrode fingers each arranged inside two different zones that are G and H alternatively arranged;
    the electrode finger is formed with a width L set to approximately $\lambda/4$ on the condition of a wavelength of the surface acoustic wave set to $\lambda$;
    an electrode period length P is set as PG and a number NG of the electrode fingers is set to 1 in zone G and the electrode period length P is set as PH and a number NH of the electrode fingers is set to 1 in zone H on the condition that electrode period length P as a sum of the width L of the electrode finger and a spacing between the electrode fingers is equal to L+S;

a ratio PH/PG of the electrode period lengths in zones G and H falls within a range of 0.8<PH/PG<1; and the electrode fingers arranged in zones G and H are connected to feeder conductors with different polarities, respectively.

8. The resonator type SAW filter according to claim 7, wherein a reflection coefficient γ of the surface acoustic wave exhibited by one of the electrode fingers generated by the piezoelectric substrate and the interdigital transducers falls within a range from 0.03 to 0.10.

9. The resonator type SAW filter according to claim 7, wherein a resonance mode to be utilized is a three-longitudinal-mode combined based on a resonance phenomenon of a fundamental wave symmetrical mode S0, a fundamental wave anti-symmetric mode A0, and a primary symmetrical mode S1; and wherein an equivalent reflection coefficient γgh of the surface acoustic wave exhibited by one of the electrode fingers provided to the whole of the interdigital transducers that are configured by alternatively arranging the electrode period lengths PG and PH falls within a range from 0.01 to 0.025.

10. The resonator type SAW filter according to claim 7, wherein the piezoelectric plate is a STW cut quartz crystal substrate; the interdigital transducer is made of aluminum metal; the reflection coefficient gamma of the surface acoustic wave exhibited by one of the electrode fingers is set to from 0.05±0.02; the ratio PH/PG of the electrode period lengths is set to 0.9±0.02; a number of pairs MK of the electrode fingers of the control interdigital transducer falls within a range from 10 to 30; a sum M of the electrode fingers of the input interdigital transducer and the output interdigital transducer is set to 80±10; an electrode cross width WC of the electrode finger is set to from 50 to 80λ; and a number of conductors of the reflectors is set to from 30 to 100.

11. The resonator type SAW filter according to claim 10, wherein the STW cut quartz crystal substrate is a quartz crystal plate having a quartz crystal Y plate rotated θ equal to from 35 to 38 degrees around an electronic axis (X axis) in a counterclockwise direction.

12. The resonator type SAW filter according to claim 7, wherein a center frequency f (Ref) of the reflector and a frequency f (IDT) generated by the interdigital transducer with the electrode period length PH are equalized.

* * * * *